(12) United States Patent
Lee et al.

(10) Patent No.: US 10,553,609 B2
(45) Date of Patent: Feb. 4, 2020

(54) SEMICONDUCTOR DEVICE

(71) Applicant: Samsung Electronics Co., Ltd., Suwon-si, Gyeonggi-do (KR)

(72) Inventors: Woong Seop Lee, Hwaseong-si (KR); Byung Kwan You, Seoul (KR); Jae Woo Kwak, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/149,581

(22) Filed: Oct. 2, 2018

(65) Prior Publication Data
US 2019/0237476 A1    Aug. 1, 2019

(30) Foreign Application Priority Data

Jan. 31, 2018  (KR) .................. 10-2018-0011991

(51) Int. Cl.
| H01L 27/11582 | (2017.01) |
|---|---|
| H01L 23/522 | (2006.01) |
| H01L 27/11519 | (2017.01) |
| H01L 27/11556 | (2017.01) |
| H01L 21/768 | (2006.01) |
| H01L 27/11565 | (2017.01) |
| H01L 21/3213 | (2006.01) |
| H01L 27/11526 | (2017.01) |
| H01L 27/11573 | (2017.01) |
| H01L 21/311 | (2006.01) |

(52) U.S. Cl.
CPC .. H01L 27/11582 (2013.01); H01L 21/76802 (2013.01); H01L 23/5226 (2013.01); H01L 27/11519 (2013.01); H01L 27/11556 (2013.01); H01L 27/11565 (2013.01); H01L 21/31105 (2013.01); H01L 21/3213 (2013.01); H01L 27/11526 (2013.01); H01L 27/11573 (2013.01)

(58) Field of Classification Search
CPC ......... H01L 27/11582; H01L 27/11519; H01L 27/11556; H01L 27/11565; H01L 21/76802; H01L 23/5226
See application file for complete search history.

(56) References Cited

U.S. PATENT DOCUMENTS

| 8,482,138 B2 | 7/2013 | Hwang et al. |
|---|---|---|
| 8,981,458 B2 | 3/2015 | Lee et al. |
| 9,472,569 B2 | 10/2016 | Lee et al. |
| 9,570,462 B2 | 2/2017 | Lee et al. |
| 9,570,463 B1 | 2/2017 | Zhang et al. |

(Continued)

Primary Examiner — Nathan W Ha
(74) Attorney, Agent, or Firm — Myers Bigel, P.A.

(57) ABSTRACT

A semiconductor device includes a substrate, a first gate structure including first gate electrodes that are vertically stacked on the substrate, first channels penetrating the first gate structure to contact the substrate, a second gate structure including a channel connection layer on the first gate structure and second gate electrodes on the channel connection layer, second channels penetrating the second gate structure to contact the first channels, respectively, and separation regions penetrating the second gate structure and the first gate structure and extending in a first direction. The second gate electrodes are vertically stacked on the channel connection layer. The channel connection layer is between the separation regions and has at least one sidewall that is spaced apart from sidewalls of the separation regions.

20 Claims, 23 Drawing Sheets

(56) References Cited

U.S. PATENT DOCUMENTS

| | | |
|---|---|---|
| 9,691,781 B1 | 6/2017 | Nishikawa et al. |
| 9,698,153 B2 | 7/2017 | Liu et al. |
| 2012/0327715 A1 | 12/2012 | Lee et al. |
| 2013/0127011 A1* | 5/2013 | Higashitani ....... H01L 27/11565 257/532 |
| 2013/0228852 A1* | 9/2013 | Kitazaki ........... H01L 29/66666 257/329 |
| 2015/0279855 A1 | 10/2015 | Lu et al. |
| 2017/0110473 A1 | 4/2017 | Lee |
| 2017/0154892 A1 | 6/2017 | Oh |
| 2017/0263618 A1* | 9/2017 | Shimojo ........... H01L 27/11519 |
| 2018/0053774 A1* | 2/2018 | Sakamoto ......... H01L 27/11556 |
| 2019/0102104 A1* | 4/2019 | Righetti ................ G06F 3/0653 |

\* cited by examiner

SEMICONDUCTOR DEVICE

CROSS-REFERENCE TO RELATED APPLICATION

This application claims priority under 35 U.S.C. § 119 to Korean Patent Application No. 10-2018-0011991 filed on Jan. 31, 2018 in the Korean Intellectual Property Office, the disclosure of which is hereby incorporated by reference in its entirety.

BACKGROUND

Example embodiments of the present disclosure relate to semiconductor devices, and, more particularly, semiconductor devices with a vertical structure.

Semiconductor devices may be used to process a high capacity data while being scaled down. Thus, semiconductor devices may be designed with relatively high degrees of integration. In some examples, highly integrated semiconductor devices may have a vertical structure.

SUMMARY

According to example embodiments of the inventive concepts, a semiconductor device may include a substrate, a first gate structure including first gate electrodes that are vertically stacked on the substrate, first channels penetrating the first gate structure to contact the substrate, a second gate structure including a channel connection layer on the first gate structure and second gate electrodes on the channel connection layer, second channels penetrating the second gate structure to contact the first channels, respectively, and separation regions penetrating the second gate structure and the first gate structure and extending in a first direction. The second gate electrodes may be vertically stacked on the channel connection layer. The channel connection layer may be between the separation regions and have at least one sidewall that is spaced apart from sidewalls of the separation regions.

According to example embodiments of the inventive concepts, a semiconductor device may include substrate, a first gate structure including first gate electrodes that are vertically stacked on the substrate, a first channel penetrating the first gate structure, a second gate structure including a channel connection layer on the first gate structure and second gate electrodes on the channel connection layer, a second channel penetrating the second structure, and a separation region penetrating the second gate structure and the first gate structure and extending in a first direction. The second gate electrodes may be vertically stacked on the channel connection layer. A sidewall of the channel connection layer may be laterally spaced apart from an extension line defined by sidewalls of the second gate electrodes, adjacent to the separation region.

According to example embodiments of the inventive concepts, a semiconductor device may include a substrate, first gate electrodes vertically spaced apart from one another on the substrate, first channels penetrating the first gate electrodes to contact the substrate, second gate electrodes vertically spaced apart from one another over the first gate electrodes, second channels penetrating the second gate electrodes and contacting the first channels, respectively, separation regions separating the first and second gate electrodes in a first direction and extending in a direction, and channel connection layers on the first gate electrodes. The channel connection layers may be spaced apart from the separation regions. Each of the channel connection layers may surround the second channels.

DETAILED DESCRIPTION

Various example embodiments will now be described more fully with reference to the accompanying drawings in which some example embodiments are shown. However, the inventive concepts may be embodied in many alternate forms and should not be construed as limited to only example embodiments set forth herein. It is noted that aspects of the invention described with respect to one embodiment may be incorporated in a different embodiment although not specifically described relative thereto. That is, all embodiments and/or features of any embodiment can be combined in any way and/or combination.

In conventional VNAND structures, as the number of memory cells increases, a multiple stack structure may be used in which molds are formed in units and channel openings are formed in the respective molds. An etch stop layer may be used to join an upper channel to a lower channel. The etch stop layer may not be completely etched when forming a common source line (CSL), which may generate defects. Some embodiments of the inventive concept stem from a realization that a channel connection layer, e.g., an etch stop layer, may be patterned prior to formation of the CSL. As a result, the channel connection layer may be spaced apart from the CSL thereby reducing the likelihood of defects being generated when the CSL is formed.

Figure 1:
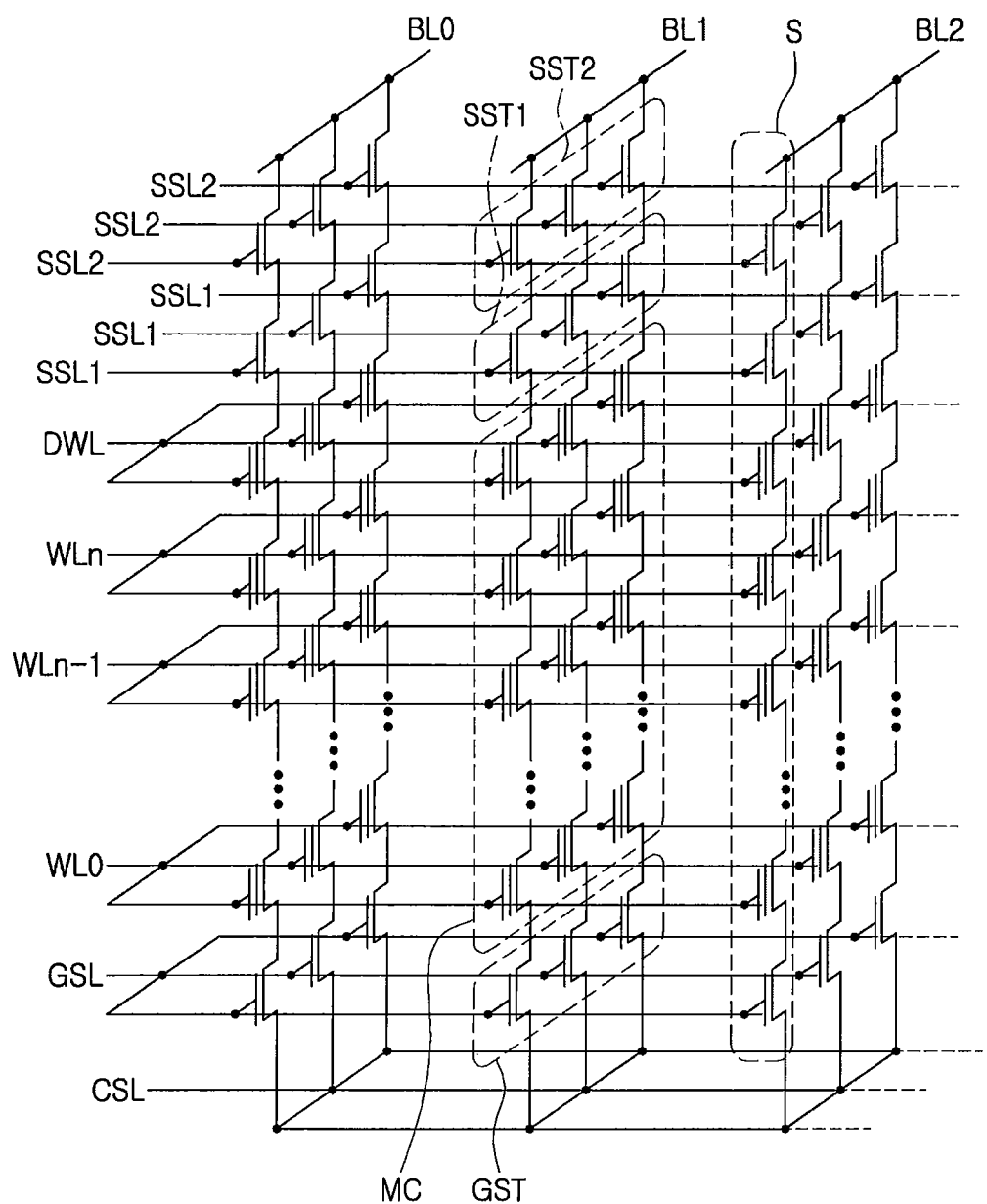
FIG. 1 is an equivalent circuit diagram of a memory cell array of a semiconductor device according to example embodiments of the inventive concept.

FIG. 1 is an equivalent circuit diagram of a memory cell array of a semiconductor device according to example embodiments of the inventive concept.

Referring to FIG. 1, a memory cell array 10 includes a plurality of cell strings S, each of which includes memory cells MC connected in series to each other, and a ground selection transistor GST and a string selection transistor SST that are connected to opposite ends, respectively, of the memory cells MC. The plurality of cell strings S may be connected in parallel to each of bit lines BL0-BL2. The plurality of cell strings S may be connected in common to a common source line CSL. For example, the plurality of cell strings S may be disposed between multiple bit lines BL0-BL2 and a single common source line CSL. In some embodiments, a plurality of common source lines CSL may be two-dimensionally arranged.

The memory cells MC connected in series may be controlled by word lines WL0-WLn for selecting the memory cells MC. Each of the memory cells MC may include a data storage element. Gate electrodes of the memory cells MC that are disposed at a substantially equal distance from the common source line CSL may be connected in common to one of the word lines WL0-WLn to be in an equal potential state. Even though the gate electrodes of the memory cells MC are disposed at a substantially equal distance from the common source line CSL, the gate electrodes disposed in different columns or rows may be independently controlled.

The ground selection transistor GST may be controlled by a ground selection line GSL and be connected to the common source line CSL. The string selection transistor SST may be controlled by string selection lines SSL1 and SSL2 and be connected to the bit lines BL0-BL2. As shown in FIG. 1, in each of the memory cell strings S, two string selection transistors SST1 and SST2 and one ground selection transistor GST may be connected to the plurality of memory cells MC connected in series. In some embodiments, in each of the memory cell single strings S, one string selection transistor SST1 or SST2 or a plurality of ground selection transistors GST may be connected to the plurality of memory cells MC connected in series. At least one dummy line DWL or at least one buffer line may be disposed between an uppermost word line WLn of the word lines WL0-WLn and the string selection lines SSL1 and SSL2. In some embodiments, at least one dummy line DWL may be disposed between a lowermost word line WL0 of the word lines WL0-WLn and the ground selection line GSL.

When a signal is applied to the string selection transistors SST1 and SST2 through the string selection lines SSL1 and SSL2, a signal applied through the bit lines BL0, BL1, and BL3 may be transmitted to the memory cells MC connected in series, such that a data read operation and a data write operation are performed. Additionally, by applying a predetermined erase voltage through a substrate, a data erase operation may be performed to erase the data written in the memory cells MC. In some embodiments, the memory cell array 10 may include at least one dummy memory cell string that is electrically isolated from the bit lines BL0-BLn.

Figure 2:
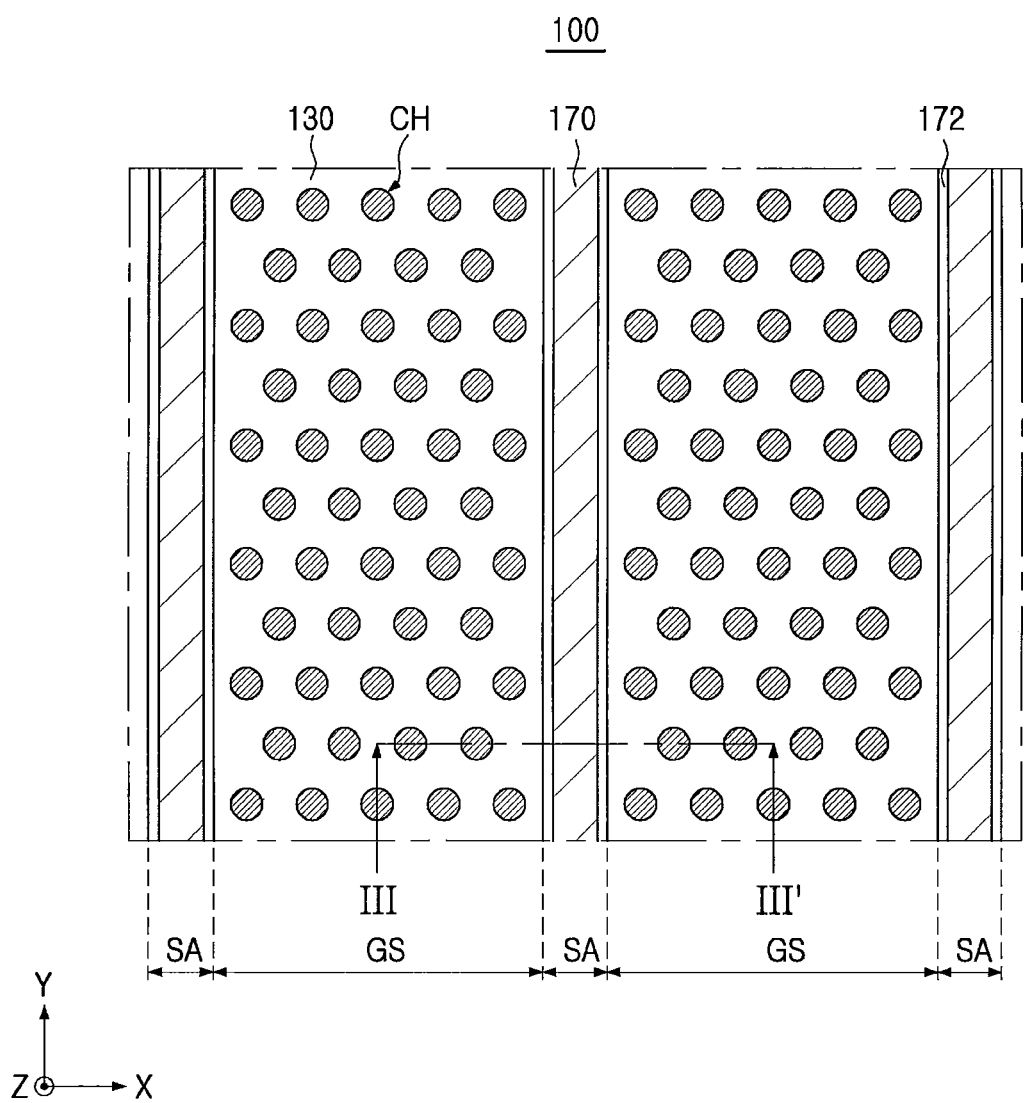
FIGS. 2 and 3 are a plan view and a cross-sectional view, respectively, of a semiconductor device according to example embodiments of the inventive concept.
Figure 3:
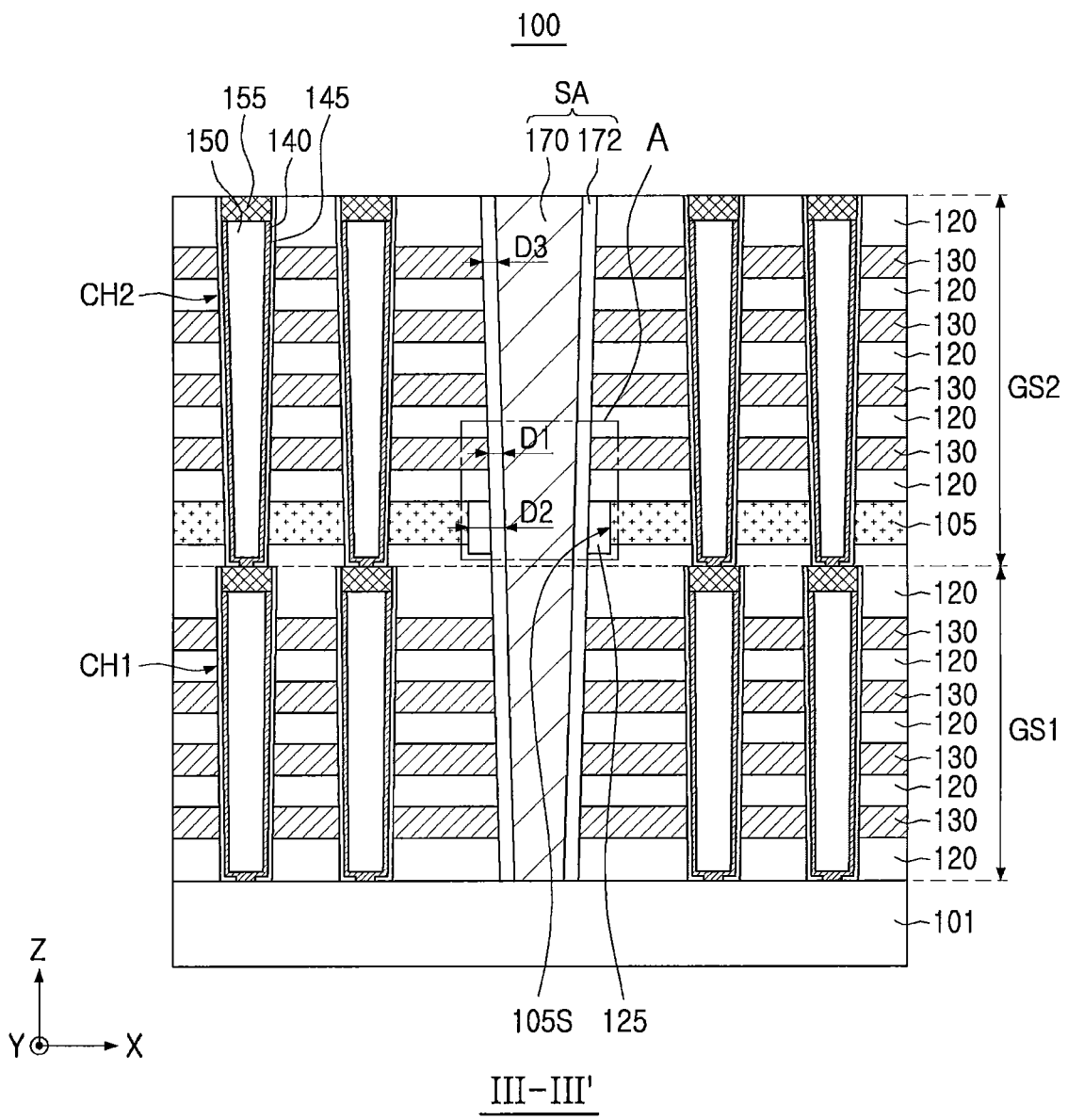
Figure 4:
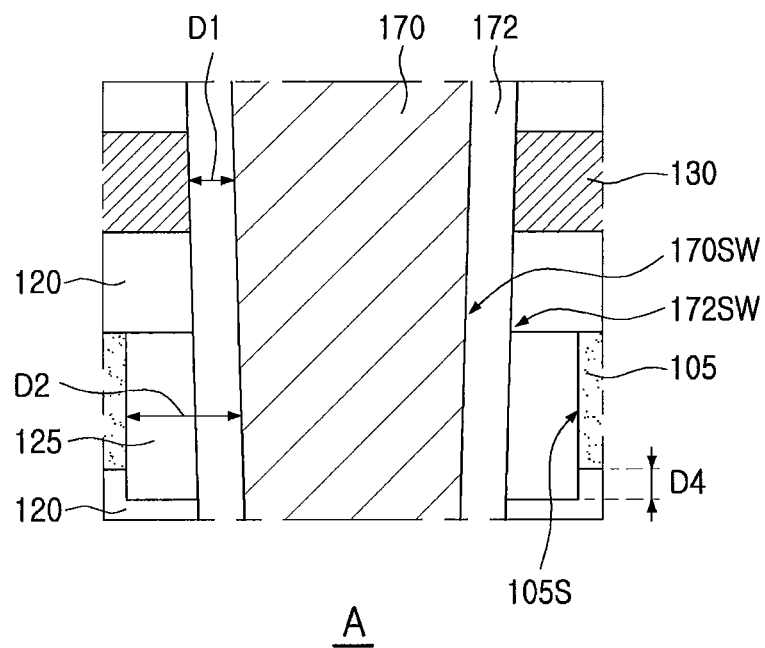
FIG. 4 is an enlarged view of portion A of FIG. 3.
Figure 5:
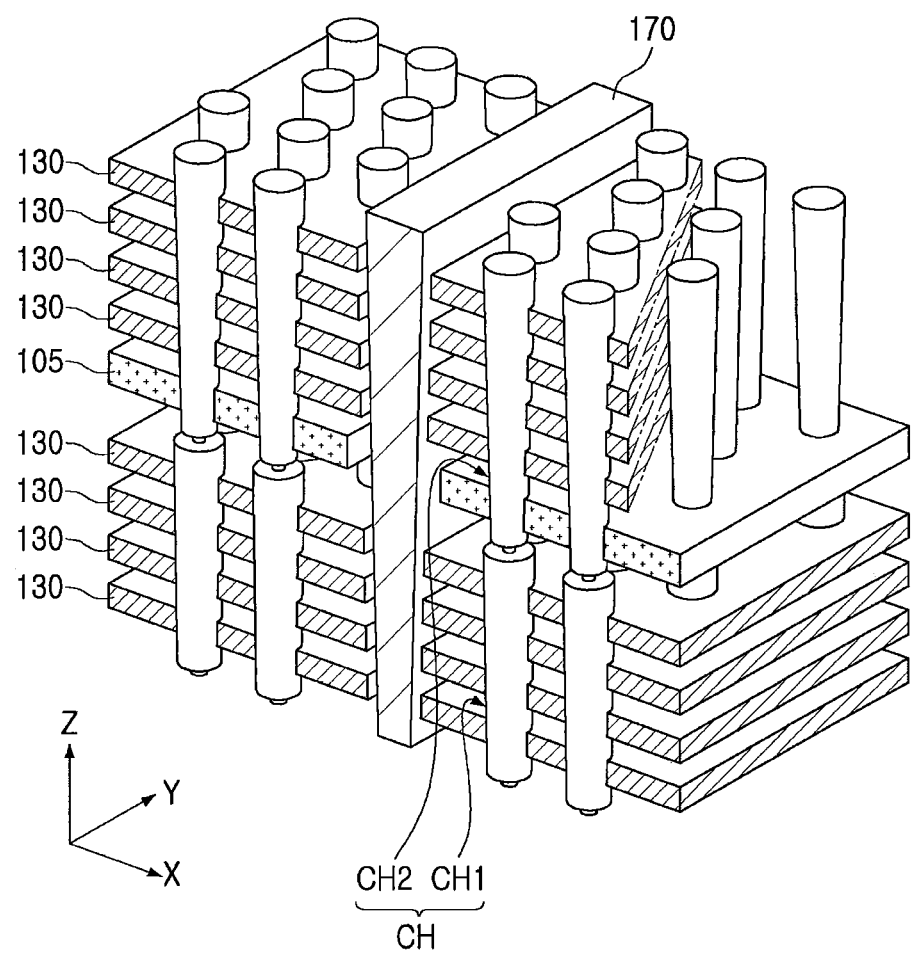
FIG. 5 is a partially cut perspective view of a semiconductor device according to example embodiments of the inventive concept.

FIGS. 2 and 3 are a plan view and a cross-sectional view, respectively, of a semiconductor device according to example embodiments of the inventive concept. FIG. 3 is a cross-sectional view taken along line III-III' of FIG. 2. FIG. 4 is an enlarged view of portion A of FIG. 3. FIG. 5 is a partially cut perspective view of a semiconductor device according to example embodiments of the inventive concept. In FIGS. 2 and 5, for convenience of illustration, only a partial configuration of a semiconductor device 100 is illustrated.

Referring to FIGS. 2 and 3, the semiconductor device 100 includes a substrate 101, gate structures GS on the substrate 101, channels CH penetrating the gate structures GS in a vertical direction perpendicular to an upper surface of the substrate 101, and separation regions SA that are alternately arranged laterally with the gate structures GS on the substrate 101.

The gate structures GS may include a first gate structure GS1 and a second gate structure GS2 that are sequentially stacked on the substrate 101. Each of the first and second gate structures GS1 and GS2 may include interlayer insulation layers 120 and gate electrodes 130 that are alternately stacked on each other. The second gate structure GS2 may further include a channel connection layer 105 below the gate electrodes 130. The channels CH may include first channels CH1 and second channels CH2 that are sequentially stacked on the substrate 101. Each of the first and second channels CH1 and CH2 may include a channel region 140, a gate insulation layer 145 between the channel region 140 and the gate electrodes 130, a channel pad 155 at an upper end of each channel CH, and a channel insulation layer 150 at least partially filling the inside of each channel CH. Each of the separation regions SA may include a source conductive layer 170 and a source insulation layer 172.

In the semiconductor device 100, one memory cell string may be configured based on each channel CH. A plurality of memory cell strings may be arranged in rows and columns in an X direction and a Y direction.

The substrate 101 may have an upper surface extending in the X direction and the Y direction. The substrate 101 may include a semiconductor material, e.g., one or more of a group IV semiconductor, a group III-V compound semiconductor, and a group II-V compound semiconductor. For example, the group IV semiconductor may include one or more of silicon, germanium, or silicon germanium. The substrate 101 may include a bulk wafer or an epitaxial layer.

The gate electrodes 130 may be stacked on the substrate 101 and be spaced apart from each other in the vertical direction. The gate electrodes 130 may include a gate electrode of the ground selection transistor GST, gate electrodes of the plurality of memory cells MC, and gate electrodes of the string selection transistors SST1 and SST2 as shown in FIG. 1. The gate electrodes 130 may function as the word lines WL0-WLn, the string selection lines SSL1 and SSL2, and the ground selection line GSL. The word lines WL0-WLn may be connected in common to the memory cells of adjacent memory cell strings S arranged in the X direction and the Y direction Y in a particular unit. The gate electrodes 130 functioning as the string selection lines SSL1 and SSL2 may be separated from each other in the X direction by a separate insulation layer.

In some embodiments, the gate electrodes 130 of the string selection transistors SST1 and SST2 and the ground selection transistor GST may respectively be one or two or more and may have the same structure or a different structure from the gate electrodes 130 of the memory cells MC. Some gate electrodes 130, e.g., the gate electrodes 130 adjacent to the gate electrode 130 of the ground selection transistor GST or each of the selection transistors SST1 and SST2, may be dummy gate electrodes. The number of the gate electrodes 130 and the number of the interlayer insulation layers 120 may be variously changed according to example embodiments. The number of the gate electrodes 130 of the first gate structures GS1 may be the same as or differ from that of the gate electrodes 130 in the second gate structure GS2.

As shown in FIG. 2, the gate structures GS, each of which includes the gate electrodes 130, may be arranged to be spaced apart from each other in the X direction by the separation regions SA extending in the Y direction. For example, the gate electrodes 130 between two or three separation regions SA may form one memory block, but a range of the memory block is not limited thereto according to various embodiments. In some embodiments, some of the separation regions SA may be cut in the X direction in an area, which is not illustrated in the drawing, thus, multiple separation regions may be spaced apart from each other in the X direction and be arranged in a row.

The gate electrodes 130 may include metal, e.g., tungsten. In some embodiments, the gate electrodes 130 may include polysilicon or metal silicide. In some embodiments, each of the gate electrodes 130 may include a diffusion barrier layer. For example, the diffusion barrier layer may include tungsten nitride, tantalum nitride, titanium nitride, or a combination thereof.

The interlayer insulation layers 120 may be disposed between the gate electrodes 130. The interlayer insulation layers 120 may be spaced apart from each other in the vertical direction and extend in the Y direction. The interlayer insulation layers 120 may include an insulating material, e.g., silicon oxide or silicon nitride. In the cross-sectional view, sidewalls of the interlayer insulation layers 120 may be vertically coplanar (or aligned) with sidewalls of the gate electrodes 130, but are not limited thereto according to various embodiments. In some embodiments, the sidewalls of the interlayer insulation layers 120 may protrude from the sidewalls of the gate electrodes 130 toward the source insulation layer 172.

The second gate structure GS2 on the first gate structure GS1 may further include a channel connection layer 105 extending parallel to the upper surface of the substrate 101. The channel connection layer 105 may be disposed between an uppermost gate electrode 130 of the first gate structure GS1 and a lowermost gate electrode 130 of the second gate structure GS2. The channel connection layer 105 may be spaced apart upward from the channel pads 155 of the first channels CH1. The channel connection layer 105 may surround the second channels CH2 together with the gate electrodes 130 of the second gate structure GS2 in a plan view of the semiconductor device 100 and extend in the Y direction. The channel connection layer 105 may be used as an etch stop layer when channel holes are formed in a process of forming the second channels CH2. Detailed descriptions thereof will be made below with reference to FIG. 13G.

Referring to FIGS. 3 and 4, the channel connection layer 105 may be spaced apart from sidewalls of the separation regions SA. The channel connection layer 105 may include a plurality of channel connection layers separated by the separation regions SA. The channel connection layer 105 may be spaced apart from an outer sidewall 170SW of the source conductive layer 170 and an outer sidewall 172SW of the source insulation layer 172, which are included in the separation region SA. A sidewall 105S of the channel connection layer 105 may be spaced apart in the X direction from an extension line defined by sidewalls of the gate electrodes 130 of the second gate structure GS2, i.e., a line extending along the outer sidewall 172SW of the source insulation layer 172. Thus, the sidewall 105S of the channel connection layer 105 may be spaced a second distance D2 apart from the source conductive layer 170. The lowermost gate electrode 130 of the second gate structure GS2 immediately adjacent to the channel connection layer 105 may be spaced apart a first distance D1 from the source conductive layer 170. Any of the other gate electrodes 130 of the second gate structure GS2 may be spaced a third distance D3 apart from the source conductive layer 170. The second distance D2 may be greater than the first distance D1 and the third distance D3 in some embodiments. Because the channel connection layer 105 is formed by being patterned before forming an opening for forming the separation regions SA, the channel connection layer 105 may be formed to have the above described structure. Detailed descriptions thereof will be made with reference to FIGS. 13D to 13I.

Even though the separation region SA is inclined with respect to the upper surface of the substrate 101, the sidewall 105S of the channel connection layer 105 may be perpendicular to the upper surface of the substrate 101, but is not limited thereto in accordance with various embodiments. An inner sidewall of the channel connection layer 105, which contacts the second channels CH, may be disposed in alignment with an extension line defined by inner sidewalls of the gate electrodes 130 of the second gate structure GS2, as shown in FIG. 3. Thus, the channel connection layer 105 may contact the second channels CH, like the gate electrodes 130 of the second gate structure GS2.

Referring to FIG. 5, the channel connection layer 105 may be a single layer disposed between the separation regions SA or the source conductive layers 170. The channel connection layer 105 may surround the second channels CH2 in a plan view of the semiconductor device 100. The channel connection layer 105 may have a rectangular shape including openings corresponding to the second channels CH2.

The channel connection layer 105 may include a conductive material or an insulating material. For example, even though the channel connection layer 105 is formed of the conductive material, an electrical signal is not applied to the channel connection layer 105, such that the channel connection layer 105 may not provide electrical functionality in the semiconductor device 100. The channel connection layer 105 may be formed of a different material from the interlayer insulation layers 120. For example, the channel connection layer 105 may be formed of a material having an etch selectivity with respect to the interlayer insulation layers 120. In some embodiments, the channel connection layer 105 may be formed of a material different from the gate electrodes 130. For example, the channel connection layer 105 may be formed of polysilicon, but is not limited thereto in accordance with various embodiments.

A buried insulation layer 125 may be disposed between the channel connection layer 105 and the separation region SA. A lower surface of the buried insulation layer 125 may be positioned at a lower level by a fourth distance D4 than a lower surface of the channel connection layer 105 with respect to the upper surface of the substrate 101. In some embodiments, the lower surface of the buried insulation layer 125 may be coplanar with the lower surface of the channel connection layer 105. The buried insulation layer 125 may be formed of an insulating material. The buried insulation layer 125 may be formed of the same material as the interlayer insulation layers 120, but is not limited thereto in accordance with various embodiments.

The channels CH may penetrate the gate structures GS and may be arranged in rows and columns on the substrate 101 to be spaced apart from each other. The channels CH may be arranged in a matrix form or in a zigzag form in a direction generally parallel with the substrate 101. The first and second channels CH1 and CH2 constituting the channels CH may be connected to each other in the vertical direction.

The channels CH may have sidewalls perpendicular to the substrate 101, or have slanted sidewalls such that a width of each of the channels CH may be narrower with increasing closeness to the substrate 101 according to an aspect ratio. The channel region 140 may be disposed inside each of the channels CH. The channel region 140 may be formed in an annular shape to surround the channel insulation layer 150 inside each of the channels CH. In some embodiments, the channel region 140 may be formed in a column shape, such as a cylinder or a polygonal column, without the channel insulation layer 150. In some embodiments, the channel region 140 may not be directly connected to the substrate 101, but may be connected to an epitaxial layer on the substrate 101. The channel region 140 may include a semiconductor material, e.g., polysilicon or mono-crystal silicon. The channel region 140 may include an undoped semiconductor material or a semiconductor material including a p- or n-type impurity. The channels CH, which are arranged in a row in the X direction, may be connected to respective ones of the bit lines BL0-BL2 (refer to FIG. 1) through an upper wiring structure connected to the respective channel pads 155. Some of the channels CH may be dummy channels, which are not electrically connected to the bit lines BL0-BL2.

In the channels CH, the channel pads 155 may be disposed on the respective channel regions 140. The channel pads 155 may cover upper surfaces of the respective channel insulation layers 150 in whole or in part and may be electrically connected to the respective channel regions 140. The channel pads 155 may include, e.g., doped polysilicon. The first and second channels CH1 and CH2 may have the same general structure. The second channels CH2 may be stacked on the first channels CH1, respectively. In some embodiments, heights of the first and second channels CH1 and CH2 may be the same as or different from each other. The channel pads 155 of the first channels CH1 may directly contact the channel regions 140, respectively, of the second channels CH2.

The gate insulation layer 145 may be disposed between the gate electrodes 130 and the channel region 140. The gate insulation layer 145 may include a tunnel layer, a charge storage layer, and a blocking layer that are sequentially laterally stacked from the channel region 140. The tunnel layer may be configured to allow charge to tunnel through by F-N tunneling and move into the charge storage layer. The tunnel layer may include, e.g., silicon oxide, silicon nitride, silicon oxynitride, or a combination thereof. The charge storage layer may be a charge trap layer or a floating gate conductive layer. In some embodiments, when the charge storage layer is the charge trap layer, the charge storage layer may include silicon nitride. The blocking layer may include, e.g., silicon oxide, silicon nitride, silicon oxynitride, a high-k dielectric material, or a combination thereof. In some embodiments, at least a portion of the blocking layer may extend in a horizontal direction along surfaces of gate electrodes 130, but is not limited thereto in accordance with various embodiments.

The separation regions SA may penetrate the gate structures GS between the channels CH and be connected to the substrate 101. The source conductive layer 170 may be spaced apart and electrically insulated from the gate electrodes 130 by the source insulation layer 172. The gate electrodes 130 may be spaced a predetermined distance apart from each other in the X direction with the source conductive layer 170 therebetween. The source conductive layer 170 may have a liner shape extending in the Y direction and may correspond to the common source line CSL (refer to FIG. 1). The source conductive layer 170 may be arranged at predetermined intervals, e.g., one by every three or four columns of the channel regions 140, but is not limited thereto in accordance with various embodiments. The source conductive layer 170 may have a width decreasing with increasing closeness to the substrate 101 due to a high aspect ratio, but is not limited thereto. In some embodiments, the source conductive layer 170 may have a sidewall perpendicular to the upper surface of the substrate 101. In some embodiments, an impurity region may be disposed in the substrate 101 to contact the source conductive layer 170.

FIGS. 6 to 9 are cross-sectional views, respectively, of a semiconductor device according to example embodiments of the inventive concept.

Figure 6:
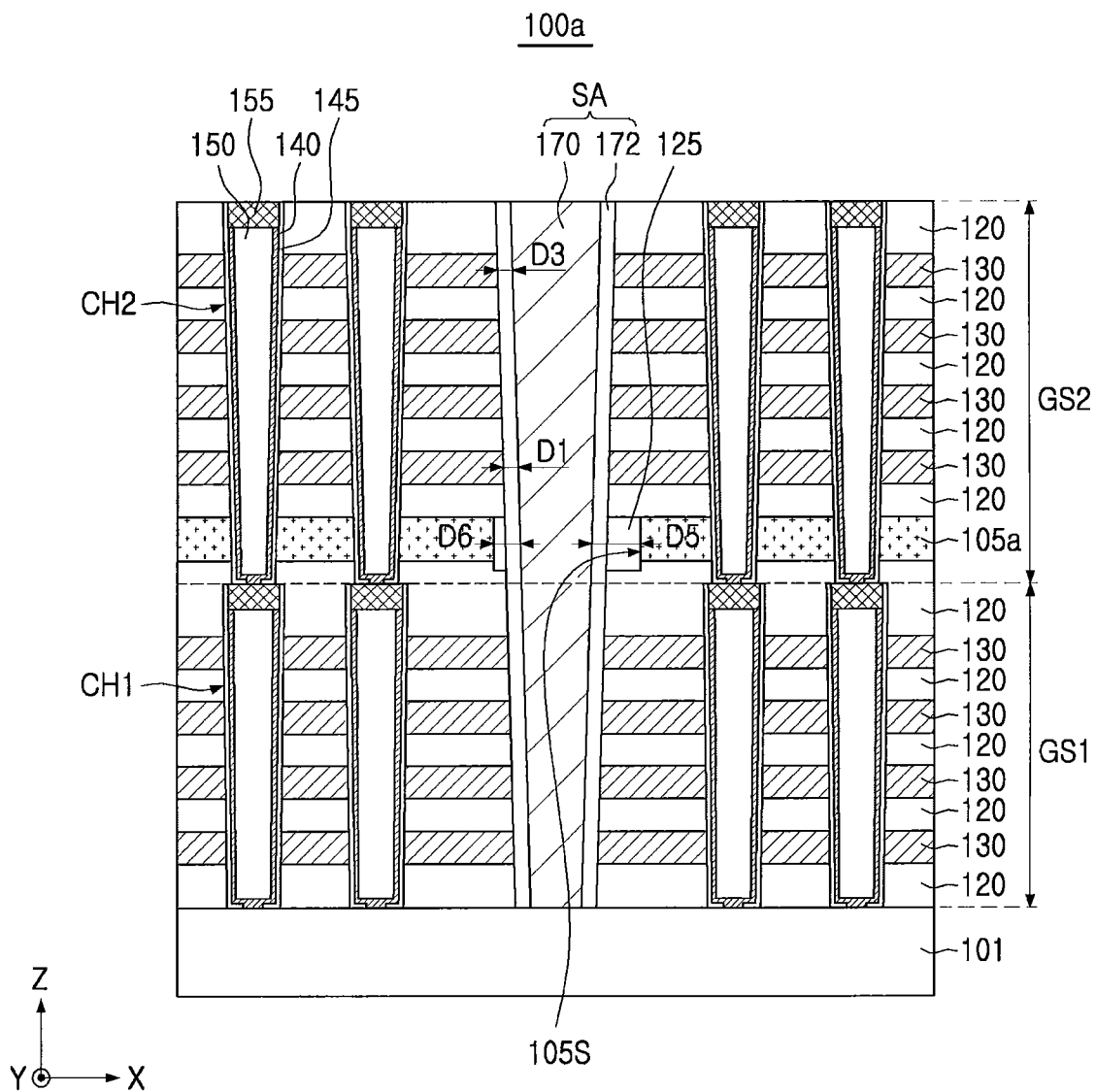
FIGS. 6 to 9 are cross-sectional views, respectively, of a semiconductor device according to example embodiments of the inventive concept.

Referring to FIG. 6, in contrast to the channel connection layer 105 shown in FIG. 3, a channel connection layer 105a of a semiconductor device 100a is asymmetrically arranged on the left and right sides of the separation region SA. For example, a fifth distance D5 at which a sidewall 105S of the channel connection layer 105a is spaced apart from the source conductive layer 170 may be greater than a sixth distance D6 at which another sidewall 105S of the channel connection layer 105a is spaced apart from the source conductive layer 170. The sixth distance D6 may be greater than the first distance D1 and the third distance D3 between the gate electrodes 130 and the source conductive layer 170.

Such a relative location of the channel connection layer 105a may be changed based on a location of the opening for forming the separation region SA or alignment accuracy during the formation of the opening.

Figure 7:
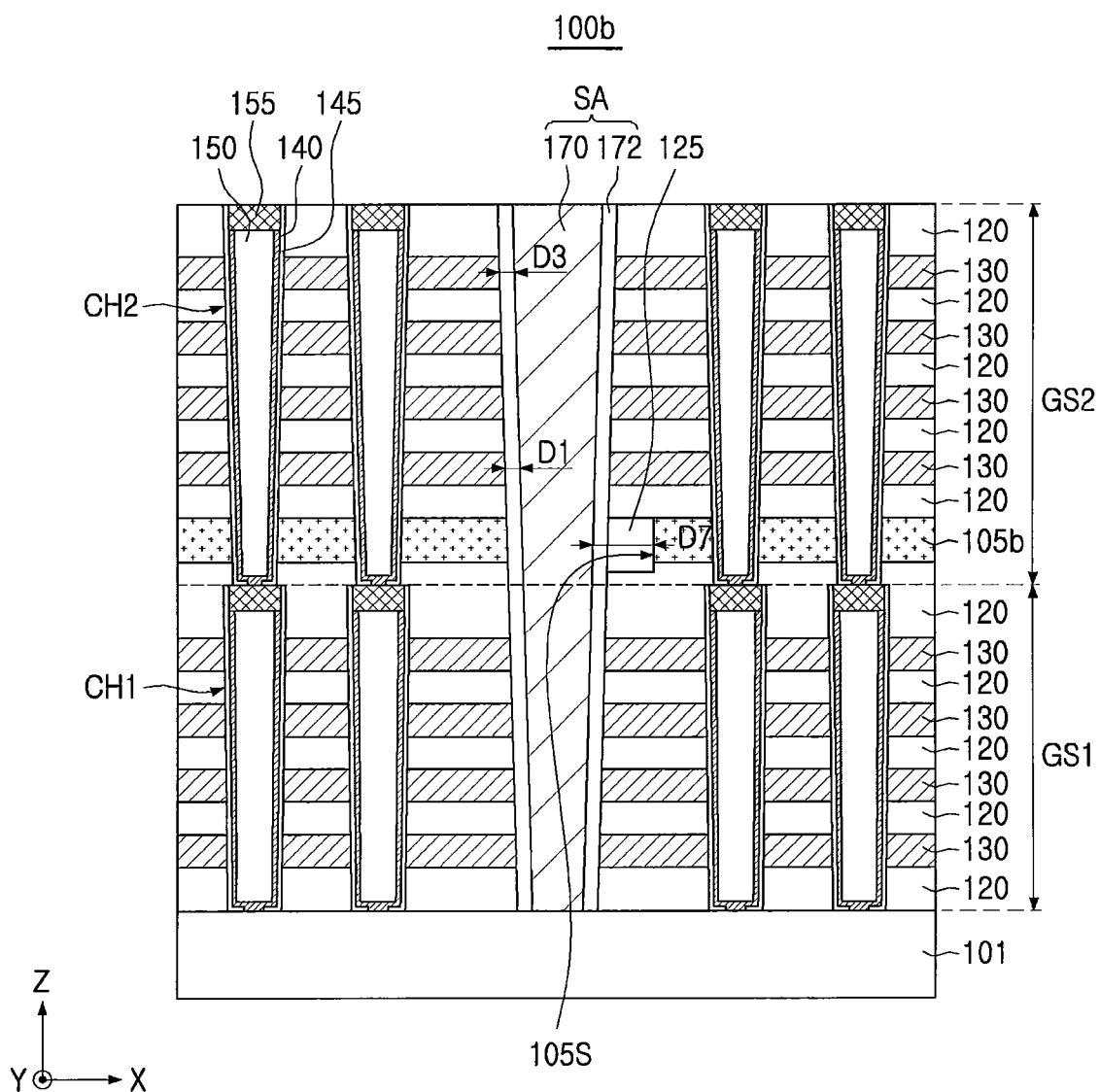

Referring to FIG. 7, in contrast to the channel connection layer 105 shown in FIG. 3, a channel connection layer 105b of a semiconductor device 100b is asymmetrically arranged on the left and right sides of the separation region SA. The channel connection layer 105b may be disposed to have a sidewall contacting the separation region SA, e.g., the source insulation layer 172, unlike the channel connection layer 105a shown in FIG. 6. A seventh distance D7 at which another sidewall 105S of the channel connection layer 105b is spaced apart from the source conductive layer 170 may be greater than the first distance D1 and the third distance D3 described above.

Such a relative location of the channel connection layer 105b may be changed based on a location of the opening for forming the separation region SA or alignment accuracy during the formation of the opening.

Figure 8:
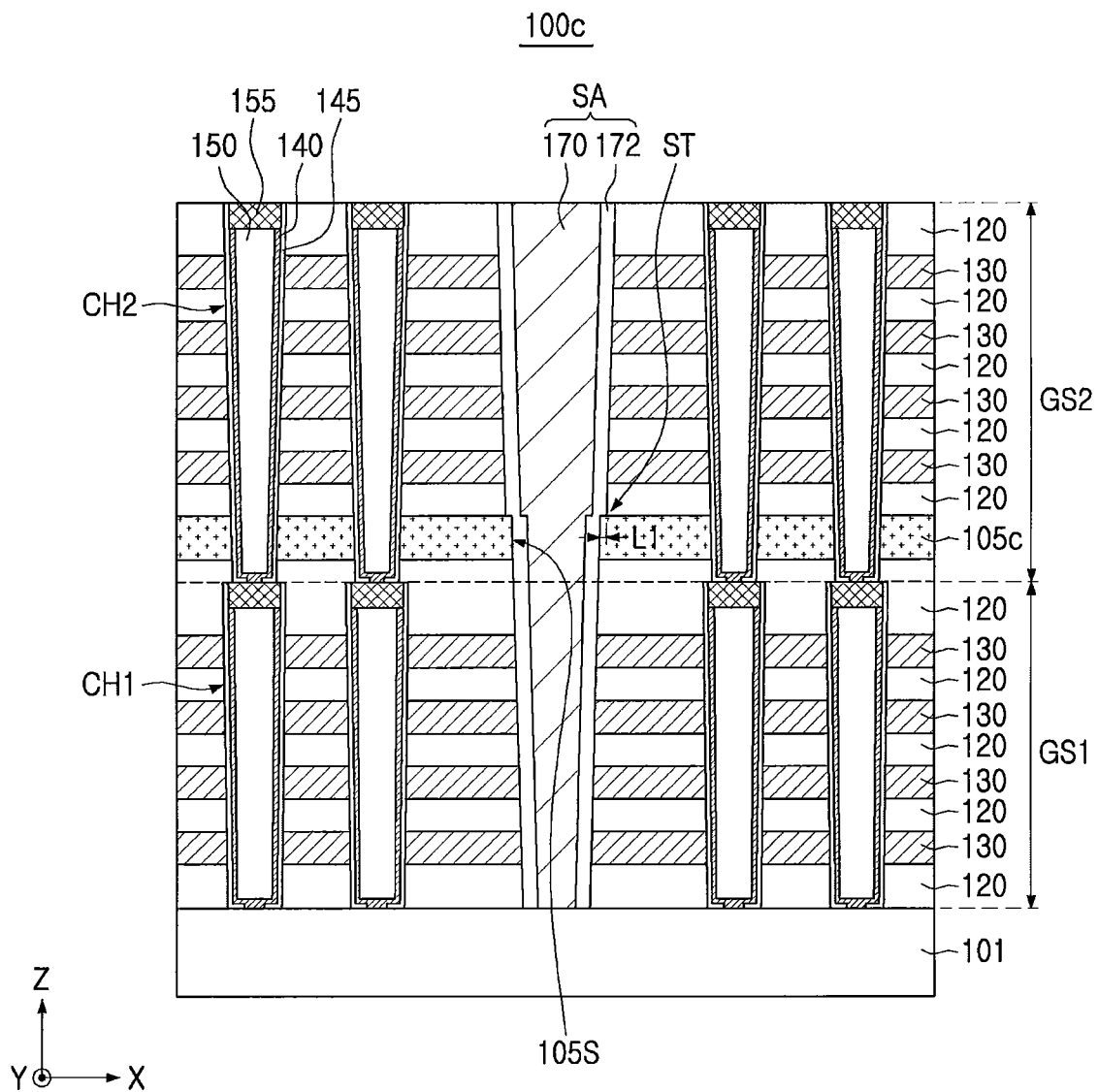

Referring to FIG. 8, in contrast to the channel connection layer 105 shown in FIG. 3, a channel connection layer 105c of a semiconductor device 100c is disposed to have a sidewall 105S protruding toward the separation region SA. The sidewall 105S of the channel connection layer 105c may be laterally spaced apart in the X direction from the extension line defined by the sidewalls of the gate electrodes 130. The sidewall 105S of the channel connection layer 105c may be spaced apart in a direction from the extension line toward the separation region SA, such that the channel connection layer 105c protrudes toward the separation region SA beyond the extension line. Thus, the separation region SA may have a stepped portion ST along an upper surface of the channel connection layer 105c in a region in which the separation region SA contacts the channel connection layer 105c. A length L1 of the stepped portion ST may vary and be different at opposite sides of the separation region SA. In some embodiments, the buried insulation layer 125 (refer to FIG. 3) may remain on the sidewall 105S or a bottom surface of the channel connection layer 105c.

Such a structure of the channel connection layer 105c and the separation region SA may be formed, e.g., when the opening for forming the separation trigon SA, which passes through the buried insulation layer 125 (refer to FIG. 3), has a greater width than a width of the buried insulation layer 125 (refer to FIG. 3). In this case, the separation region SA may have a structure aligned by the channel connection layer 105c.

Figure 9:
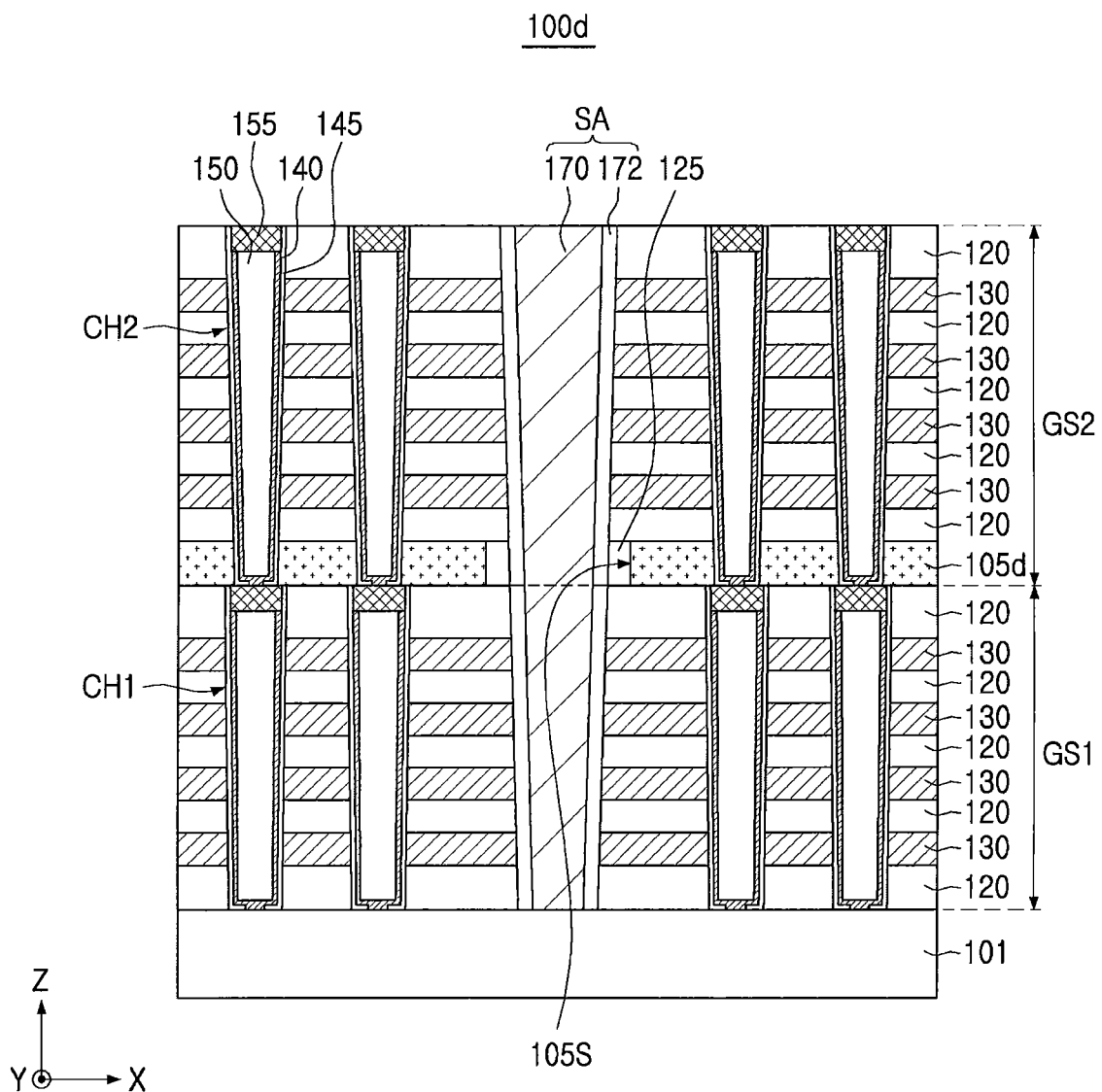

Referring to FIG. 9, in contrast to the channel connection layer 105 shown in FIG. 3, a channel connection layer 105d of a semiconductor device 100d is disposed to have a lower surface which is positioned at the same level as upper surfaces of the channel pads 155 of the first channels CH1.

The channel connection layer 105d may directly contact a portion of each of the channel pads 155, or not directly contact the channel pads 155 by the gate insulation layer 145. When the channel connection layer 105d directly contacts the channel pads 155, the channel connection layer 105d may be formed of an insulating material.

Figure 10:
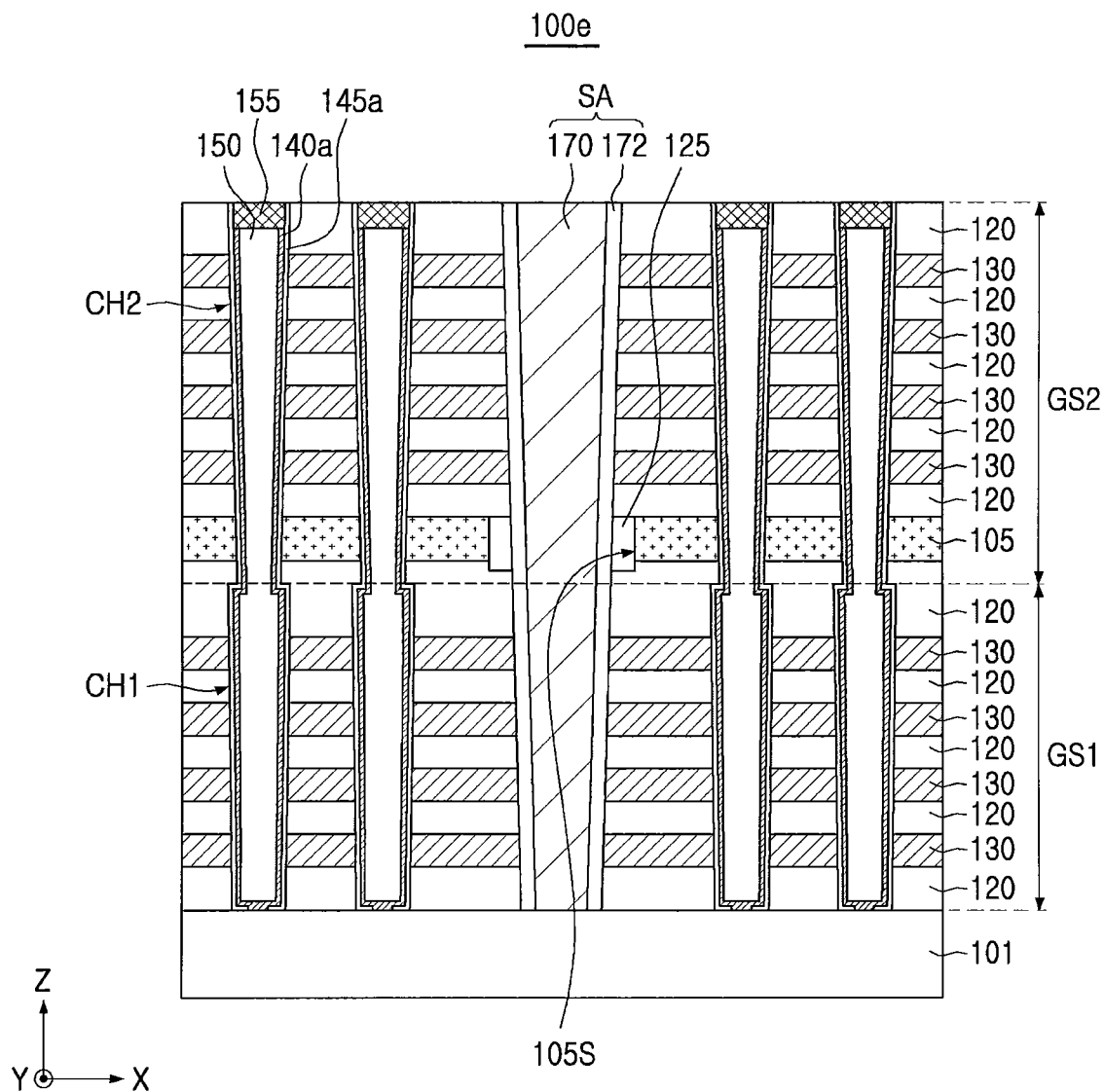
FIGS. 10 and 11 are cross-sectional views, respectively, of a semiconductor device according to example embodiments of the inventive concept.
Figure 11:
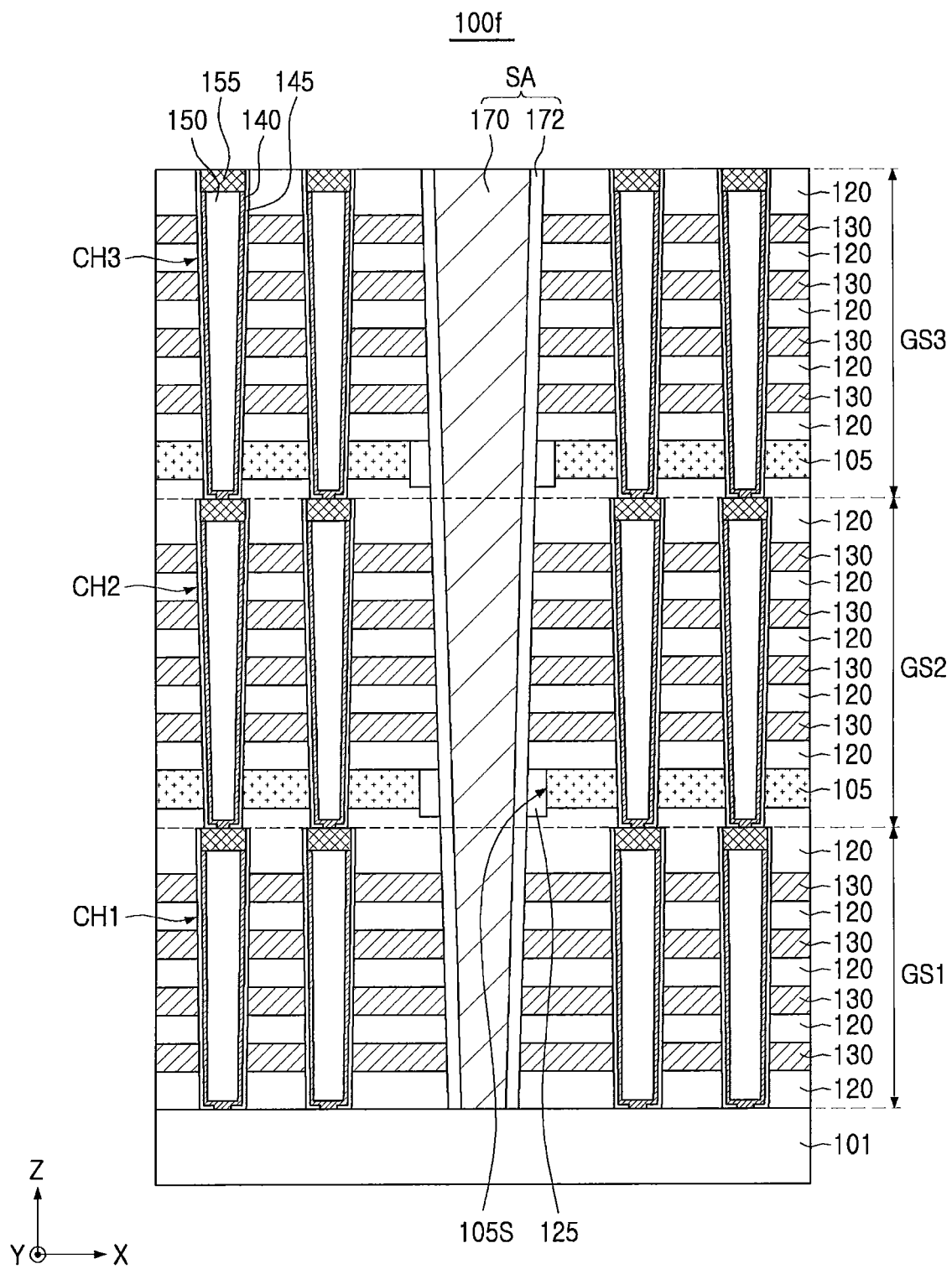

FIGS. 10 and 11 are cross-sectional views, respectively, of a semiconductor device according to example embodiments of the inventive concepts.

Referring to FIG. 10, in contrast with the first and second channels CH1 and CH2 shown in FIG. 3, in the first and second channels CH1 and CH2 of a semiconductor device 100e, each of a channel region 140a and a gate insulation layer 145a continuously extends from a respective one of the second channels CH1 to a corresponding one of the first channels CH2. For example, each of combinations of the first channels CH1 and the second channels CH2, which are stacked, may have a single channel pad 155 at an upper portion of a corresponding one of the second channels CH2. Each of the channel regions 140a and the gate insulation layer 145a may have a stepped portion at an interface between each of the first channels CH1 and each of the second channels CH2, but is not limited thereto in accordance with various embodiments.

Such a structure of the first and second channels CH1 and CH2 may be fabricated by forming each of the channel region 140a and the gate insulation layer 145a at once. Because channel holes for forming the first and second channels CH1 and CH2 are formed in different process stages, the channel connection layer 105 may be used to control depths of the channel holes when forming the second channels CH2.

Referring to FIG. 11, in contrast with the embodiments described with reference to FIG. 3, a semiconductor device 100f includes first, second, and third gate structures GS1, GS2, and GS3 and first, second, and third channels CH1, CH2, and CH3. The gate structures GS may include three (first to third) gate structures GS1, GS2, and GS3, which are sequentially stacked on the substrate 101. The channels CH may include three (first to third) channels CH1, CH2, and CH3, which are sequentially stacked on the substrate 101.

The third gate structure GS3 may include the channel connection layer 105, the interlayer insulation layers 120, and the gate electrodes 130 like the first and second gate structures GS1 and GS2. The third channels CH3 may have the same structure as or a structure similar to the first and second channels CH1 and CH2. The separation region SA may penetrate the first to third gate structures GS1, GS, and GS3 to extend to the substrate 101. As such, in some embodiments, the number of the vertically stacked gate structures GS may vary in accordance with different embodiments of the inventive concept.

Figure 12:
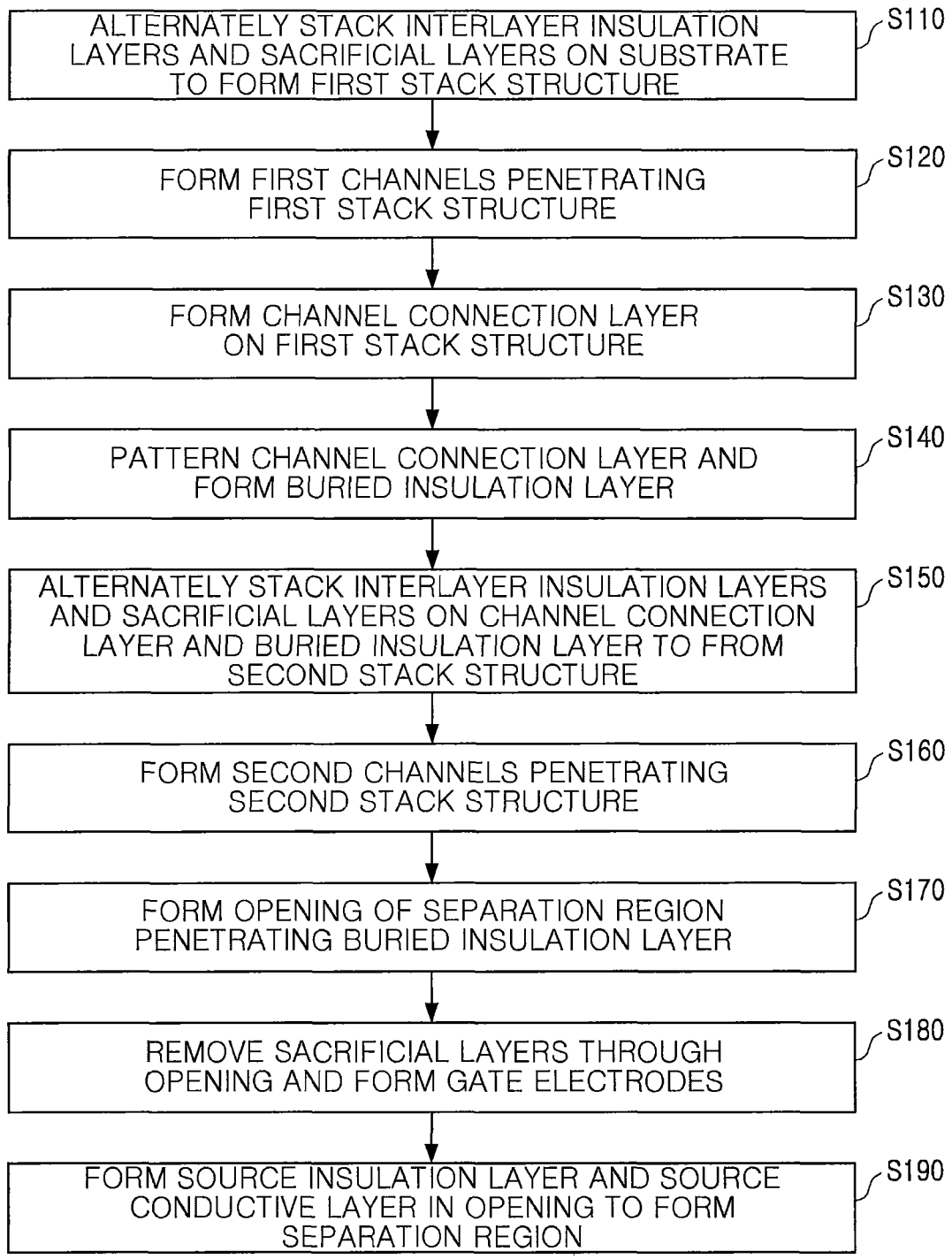
FIG. 12 is a flow chart illustrating a method of manufacturing a semiconductor device according to example embodiments of the inventive concept.

FIG. 12 is a flow chart illustrating a method of manufacturing a semiconductor device according to example embodiments of the inventive concept. FIGS. 13A to 13I are cross-sectional views of stages in a method of manufacturing a semiconductor device according to example embodiments of the inventive concept. FIGS. 13A to 13I illustrate regions corresponding to the cross-section of FIG. 3.

Figure 13A:
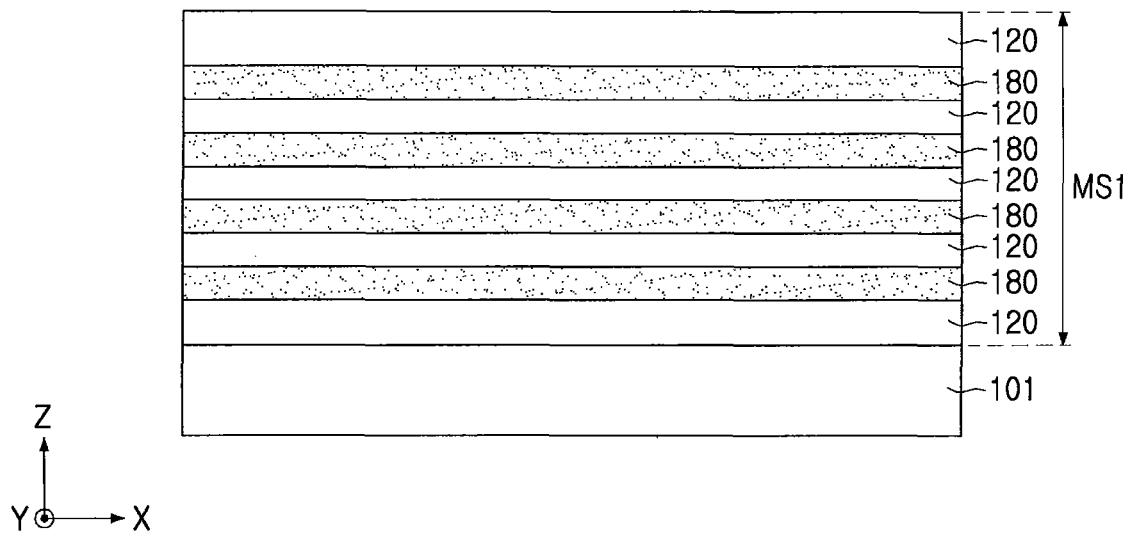
FIGS. 13A to 13L are cross-sectional views of stages in a method of manufacturing a semiconductor device according to example embodiments of the inventive concept.

Referring to FIGS. 12 and 13A, at block S110, the interlayer insulation layers 120 and sacrificial layers 180 are alternately stacked on the substrate 101 to form a first stack structure MS1.

The sacrificial layers 180 may be replaced with the gate electrodes 130 through the following process: The sacrificial layers 180 may be formed of a different material from the interlayer insulation layers 120. For example, the interlayer insulation layers 120 may be formed of, e.g., silicon oxide or silicon nitride. The sacrificial layers 180 may be formed of silicon, silicon oxide, silicon carbide, or silicon nitride and be formed of a different material from the interlayer insulation layers 120. In some embodiments, at least some of the thicknesses of the interlayer insulation layers 120 may differ from each other. For example, the lowermost interlayer insulation layer 120 may be formed relatively thin, compared to the uppermost interlayer insulation layer 120, and the uppermost interlayer insulation layer 120 may be formed relatively thick, compared to another of the interlayer insulation layers 120. The number and thicknesses of the interlayer insulation layers 120 and the sacrificial layers 180 may vary in accordance with different embodiments of the inventive concept.

Figure 13B:
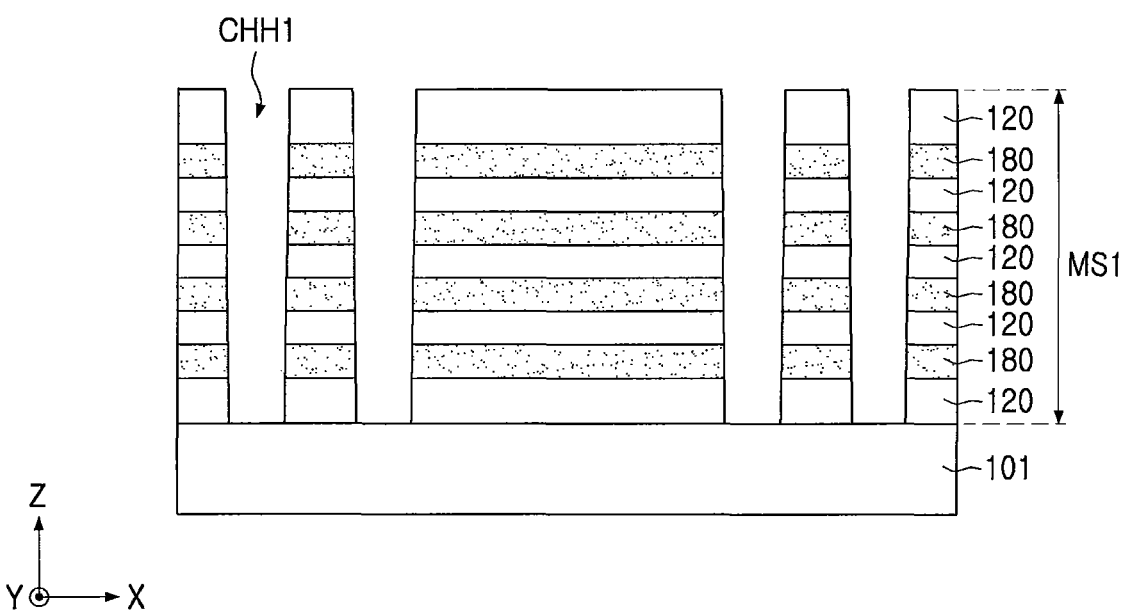

Referring to FIG. 13B, first channel holes CHH1 are formed to penetrate the first stack structure MS1.

Each of the first channel holes CHH1 may be formed by anisotropically etching the first stack structure MS1 and be formed so as to have a hole shape. A sidewall of each of the first channel holes CHH1 may not be perpendicular to the upper surface of the substrate 101. In some embodiments, when the channel holes CHH1 are formed, the substrate 101 may be recessed. In some embodiments, an epitaxial layer may be formed in each of the channel holes CHH1.

In some embodiments, when the gate electrodes 130 (refer to FIG. 3) comprising the string selection lines SSL1 and SSL2 (refer to FIG. 1) are separated, the predetermined number of the sacrificial layers 180 and the interlayer insulation layers 120 may be removed from an area between the first channel holes CHH1 and then an additional insulation layer including the same material as the interlayer insulation layers 120 may be formed in the removed area.

Figure 13C:
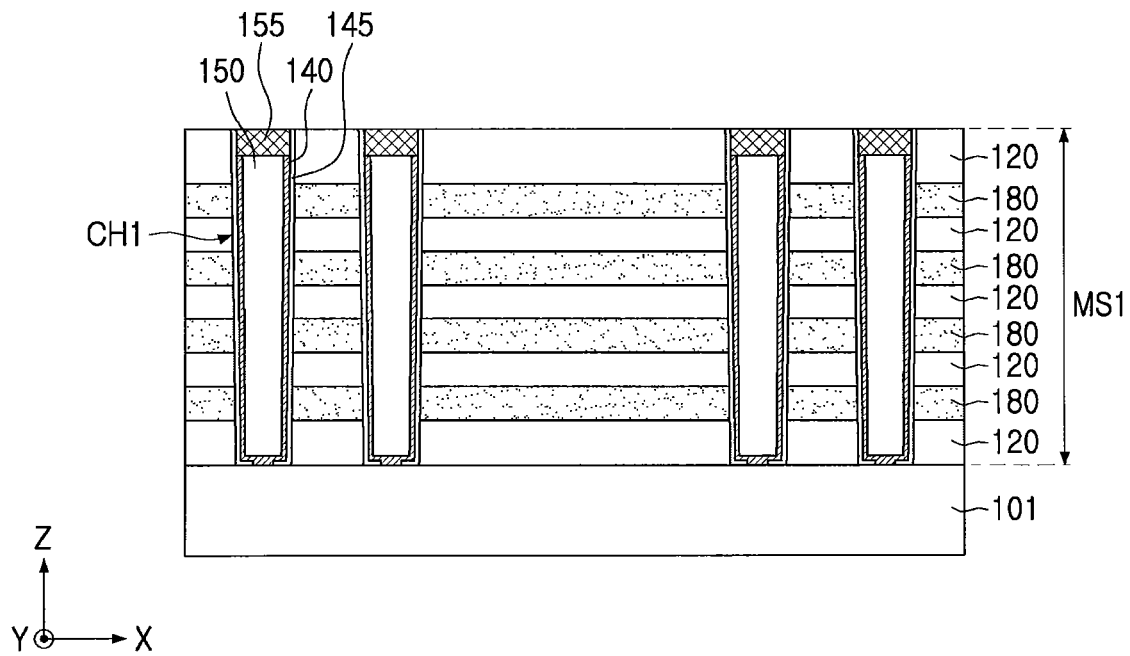

Referring to FIGS. 12 and 13C, at block S120, the gate insulation layer 145, the channel region 140, the channel insulation layer 150, and the channel pad 155 are formed in each of the first channel holes CHH1 to form the first channels CH1.

The gate insulation layer 145 may be formed to have a uniform thickness using, for example, atomic layer deposition (ALD) or chemical vapor deposition (CVD). In the present operation, all or part of the gate insulation layer 145 may be formed, and the gate insulation layer 145 formed to extend vertical to the substrate 101 along each of the first channel holes CHH1. The channel region 140 may be formed on the gate insulation layer 145 in each of the first channel holes CHH1. The channel insulation layer 150 may be formed to at least partially fill each of the first channel holes CHH1 and include an insulation material. In some embodiments, a conductive material rather than the channel insulation layer 150 may at least partially fill a space defined by the channel region 140. The channel pad 155 may be formed of a conductive material, e.g., polysilicon.

Figure 13D:
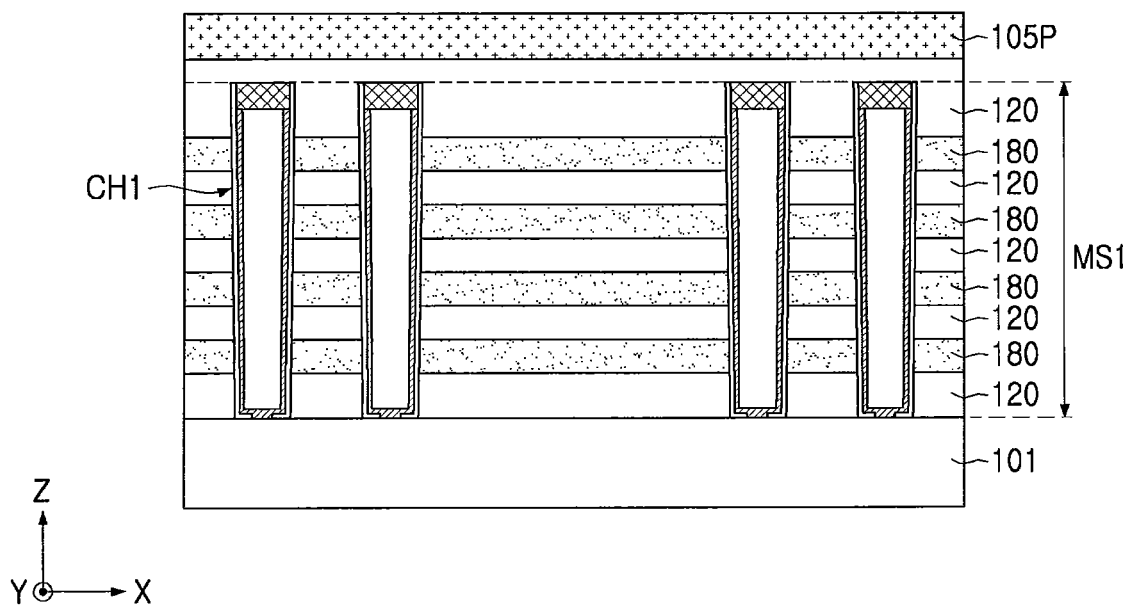

Referring to FIGS. 12 and 13D, at block S130, a channel connection layer 105P is formed on the first stack structure MS1.

Before forming the channel connection layer 105P, an interlayer insulation layer 120 may be additionally formed on the first stack structure MS1. In some example embodiments described with reference to FIG. 9, the channel connection layer 105P may be directly formed on the first stack structure MS1.

The channel connection layer 105P may be formed generally parallel to an upper surface of the first stack structure MS1. A thickness of the channel connection layer 105P may be greater than the thickness of each of the sacrificial layers 180, but is not limited thereto in accordance with various embodiments.

Figure 13E:
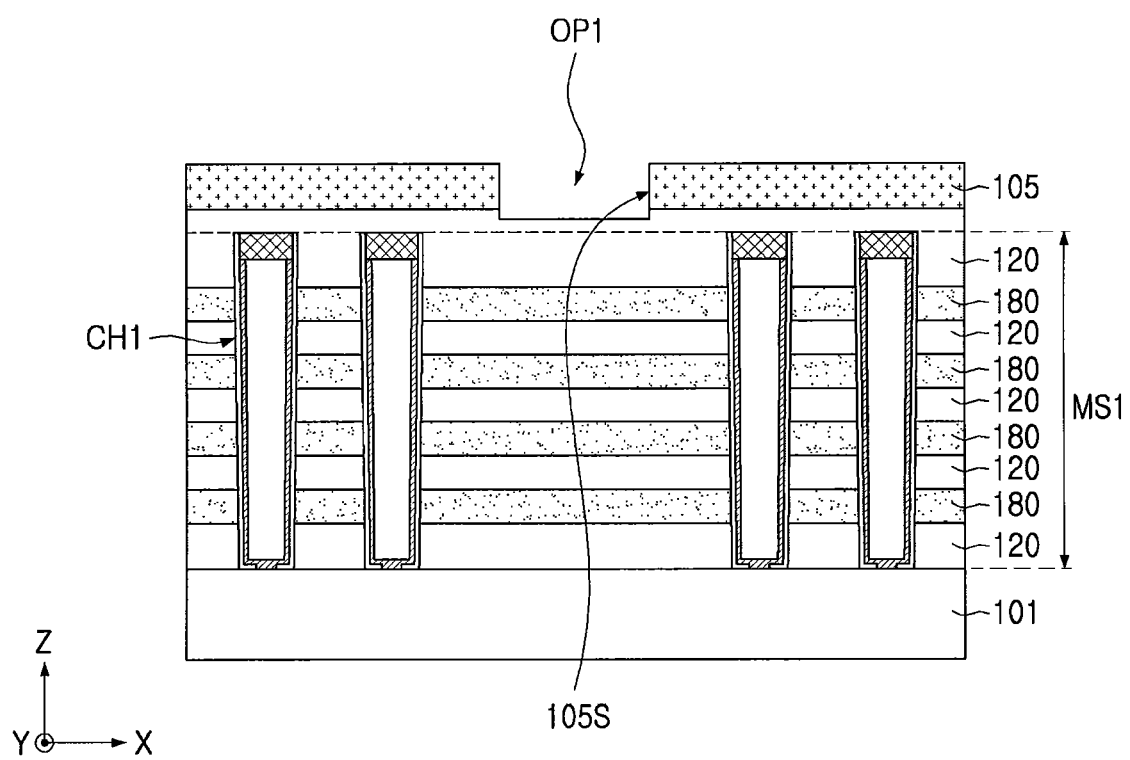

Referring to FIGS. 12 and 13E, at block S140, the channel connection layer 105P is patterned to form a first opening OP1.

The channel connection layer 105P may be patterned by forming a mask pattern through a photolithography process and removing a portion of the channel connection layer 105P using the mask layer as an etch mask. The first opening OP1 may have a trench shape and extend in the Y direction. The channel connection layer 105 formed after patterning may be separated by the first opening OP1. The first opening OP1 may be formed to recess the additional interlayer insulation layer 120 thereunder. A sidewall 105S of the channel connection layer 105 that is exposed by the first opening OP1 may be generally perpendicular to the upper surface of the substrate 101.

An area, in which the first opening OP1 is formed, may include an area in which the separation region SA (refer to FIG. 2) is to be formed. For example, the first opening OP1 may be formed to have a larger width than a width of the separation region SA (refer to FIG. 1), in consideration of a process deviation. However, in some example embodiments described with reference to FIG. 8, the first opening OP1 may be formed to have a relatively small width, such that the channel connection layer 105 may be exposed when forming an opening for the separation region SA.

Figure 13F:
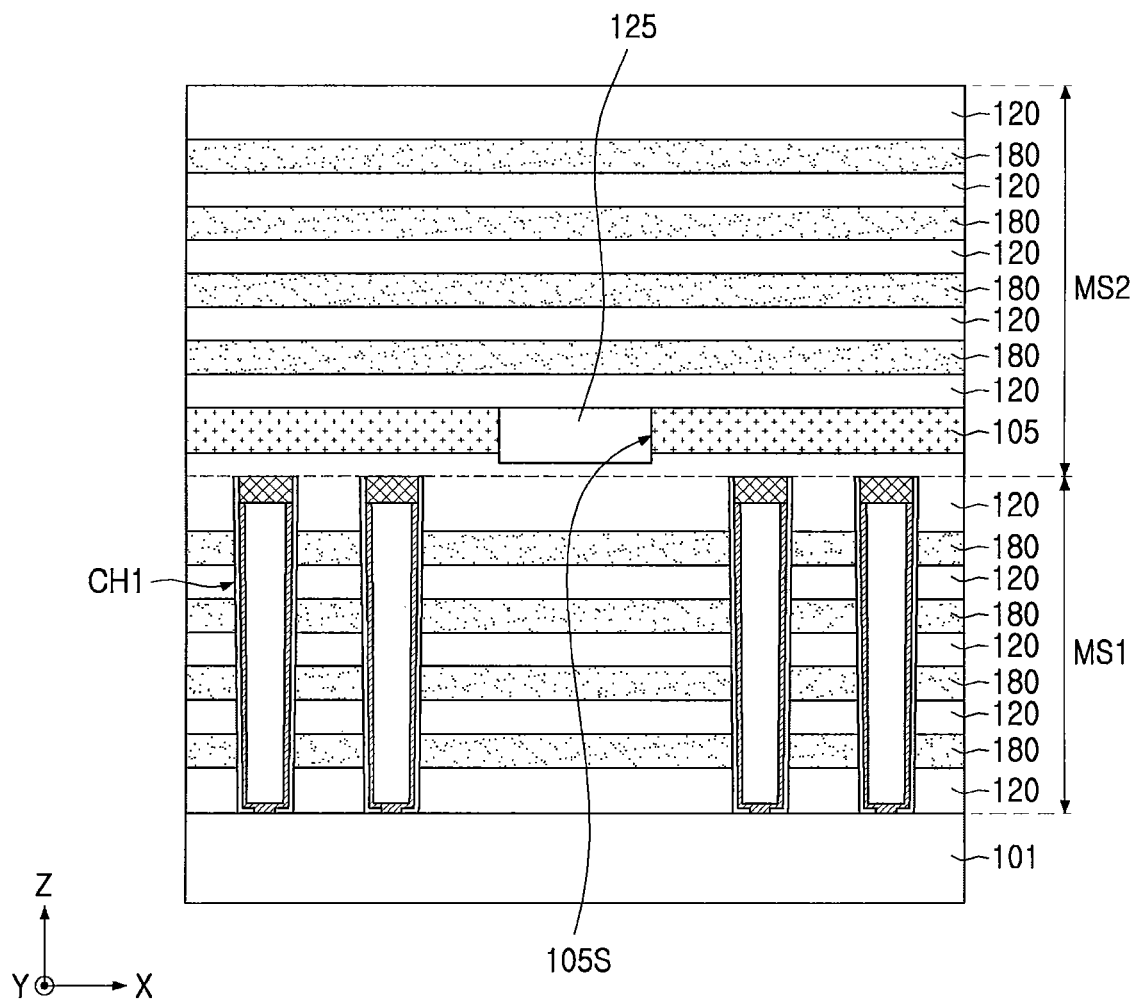

Referring to FIGS. 12 and 13F, at block S140, the buried insulation layer 125 is formed to fill the first opening OP1. At block S150, the interlayer insulation layers 120 and the sacrificial layers 180 may be alternately stacked on the buried insulation layer 125 and the channel connection layer 105 to form the second stack structure MS2.

The buried insulation layer 125 may be formed by, e.g., by depositing an insulating material to fill the first opening OP1 and planarizing the insulating material using a chemical mechanical polishing (CMP) process.

The second stack structure MS2 may include the channel connection layer 105.

Figure 13G:
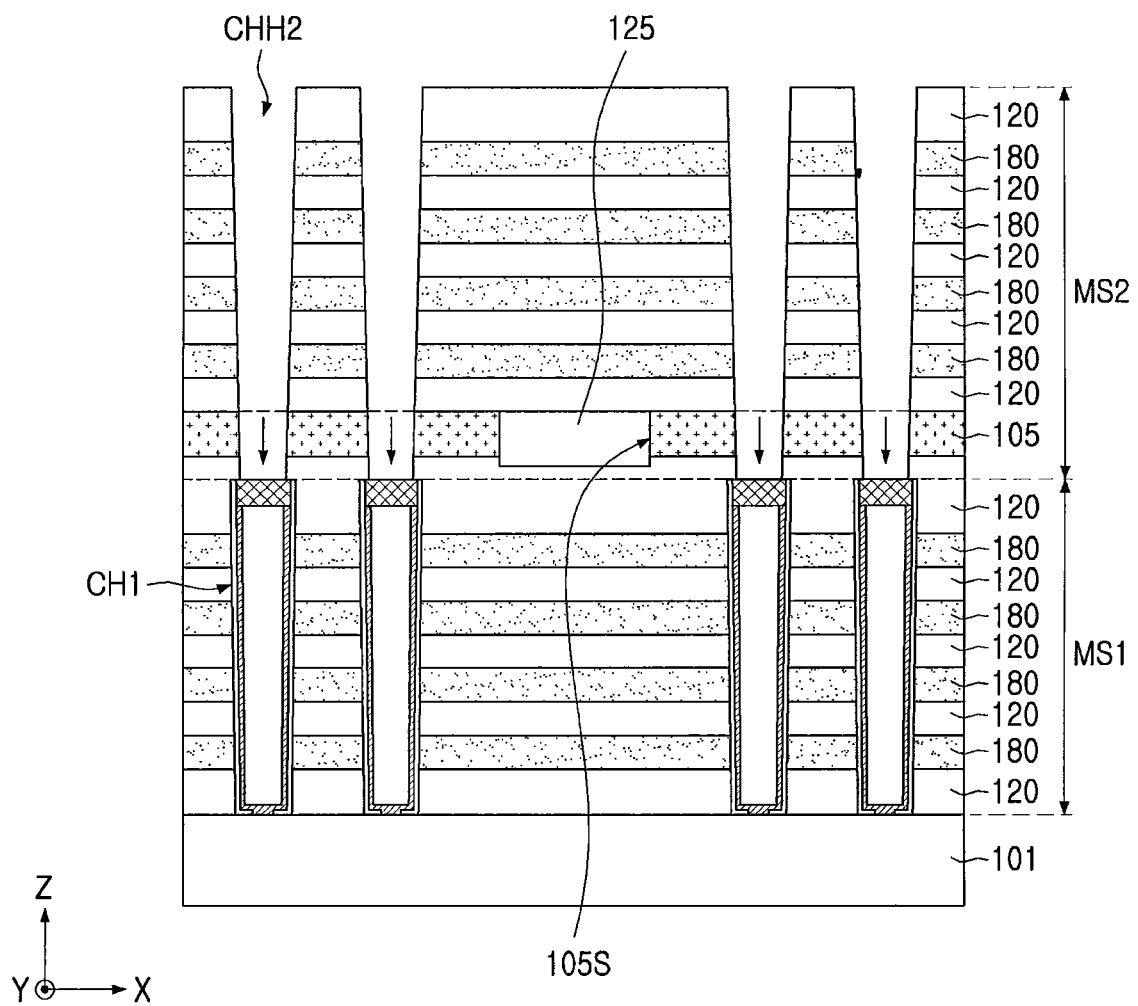

Referring to FIG. 13G, second channel holes CHH2 are formed to penetrate the second stack structure MS2.

Each of the second channel holes CHH2 may be formed by anisotropically etching the second stack structure MS2 and be formed in an opening having a hole shape. The second channel holes CHH2 may be formed by performing an etching process on the second stack structure MS2 using a first etchant until exposing the channel connection layer 105 and then selectively etching the channel connection layer 105 using a second etchant different from the first etchant, as indicated by an arrow in FIG. 13G. The channel connection layer 105 may function as an etch stop layer to control an etch depth of the second channel holes CHH2.

Each of the second channel holes CHH2 may be formed to expose at least a portion of the channel pad 155 of each of the first channels CH1. Sidewalls of the second channel holes CHH2 may not be perpendicular to the upper surface of the substrate 101.

Figure 13H:
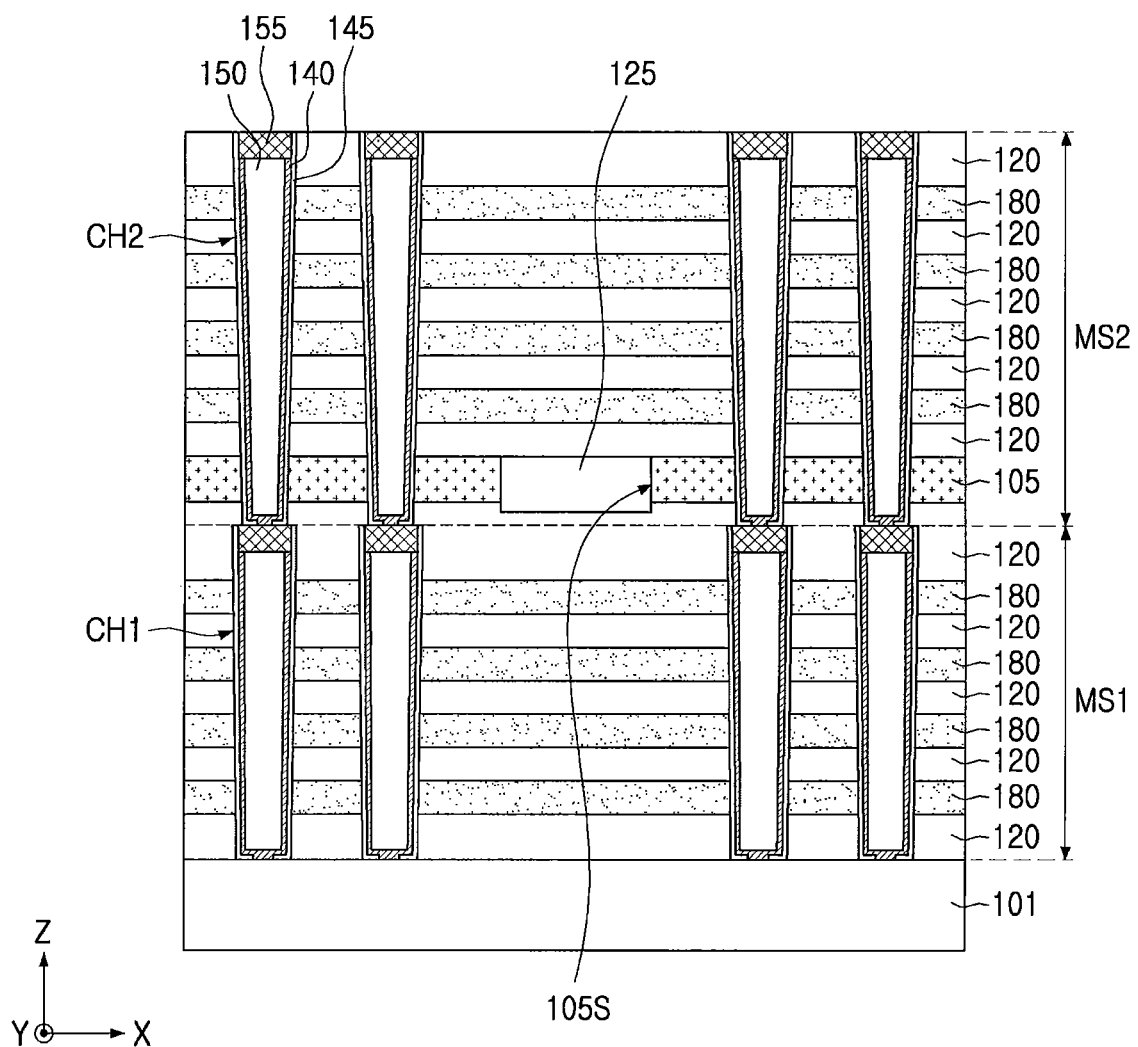

Referring to FIGS. 12 and 13H, at block S160, the gate insulation layer 145, the channel region 140, the channel insulation layer 150, and the channel pad 155 are formed in each of the second channel holes CHH2 to form the second channels CH2.

The second channels CH2 may be formed by a process similar to that of forming the first channels CH1 described with reference to FIG. 13C. The channel regions 140 at lower ends of the second channels CH2 may be connected to the channel pads 155 of the first channels CH1 thereunder.

Figure 13I:
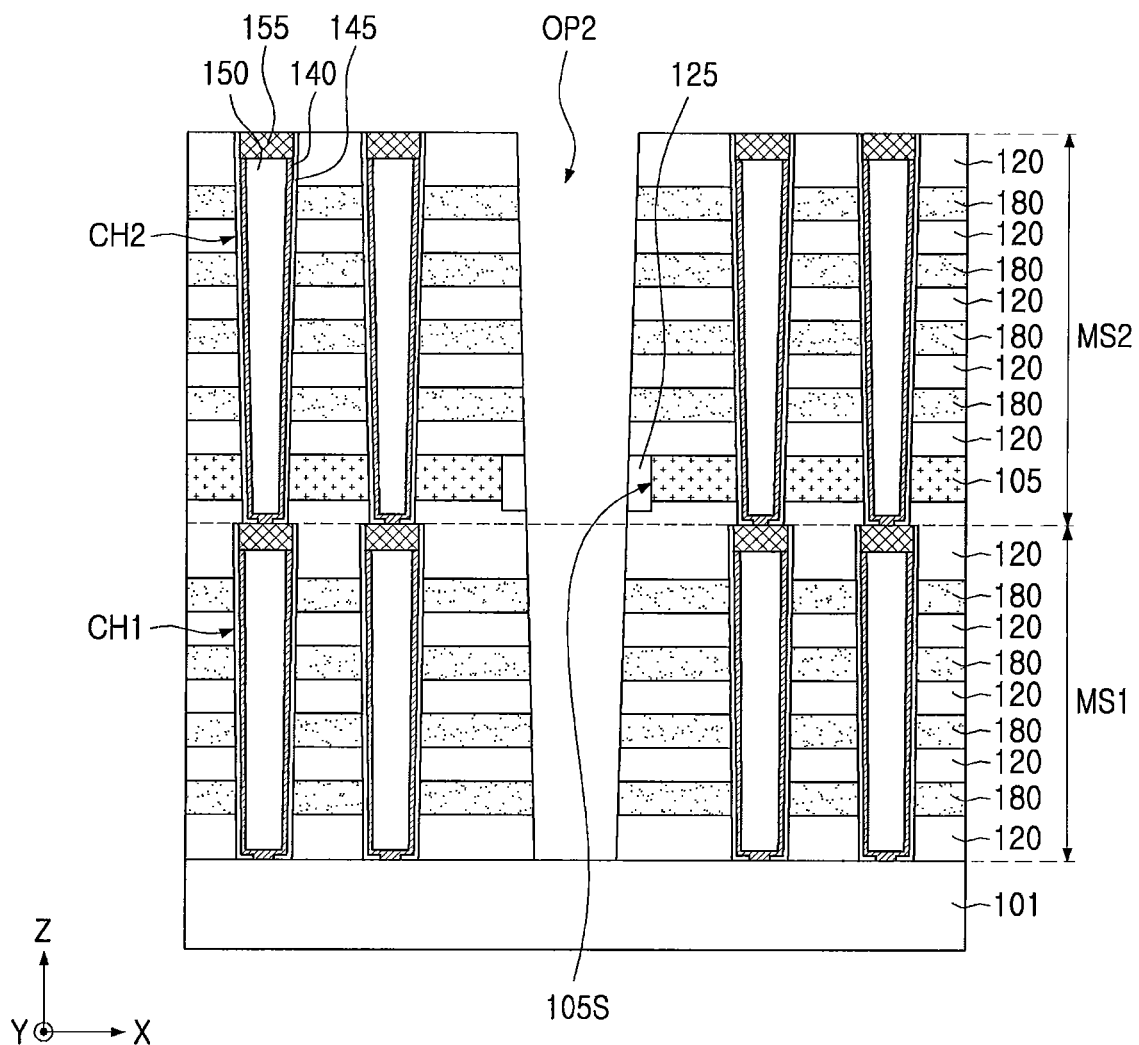

Referring to FIGS. 12 and 13I, at block S170, a second opening OP2 is formed to penetrate the buried insulation layer 125.

The second opening OP2 may be formed by forming a mask layer using a photolithography process and anisotropically etching the sacrificial layers 180, the interlayer insulation layers 120, and the buried insulation layer 125 using the mask layer as an etch mask. The second opening OP2 may penetrate the first and second stack structures MS1 and MS2 in a region that vertically overlaps the buried insulation layer 125 to expose the substrate 101. In some embodiments, before forming the second opening OP2, an additional insulation layer may be formed on the uppermost interlayer insulation layer 120 and the channel pad 155 of the second stack structure MS2 to prevent or reduce damage to the second channels CH2.

The second opening OP2 may be formed to penetrate all of the first and second stack structures MS1 and MS2. Thus, a sidewall of the second opening OP2 may not be perpendicular to the upper surface of the substrate 101. The second opening OP2 may extend in the Y direction and have a trench shape. Even though the total thickness of the first and second stack structures MS1 and MS2 is relatively large, the first and second stack structures MS1 and MS2 may be etched at once, thus forming the second opening OP2.

Because the channel connection layer 105 on the first stack structure MS1 is patterned and the buried insulation layer 125 is formed between the patterned channel connection layer 105, the second opening OP2 may be more efficiently formed, compared to the case in which the channel connection layer 105 is not be patterned. For example, even though the second opening OP2 is formed using an etchant having a relatively low etch rate with respect to the channel connection layer 105, the second opening OP2 may be efficiently formed because the channel connection layer 105 has been removed in the area in which the second opening OP2 is formed.

Figure 13J:
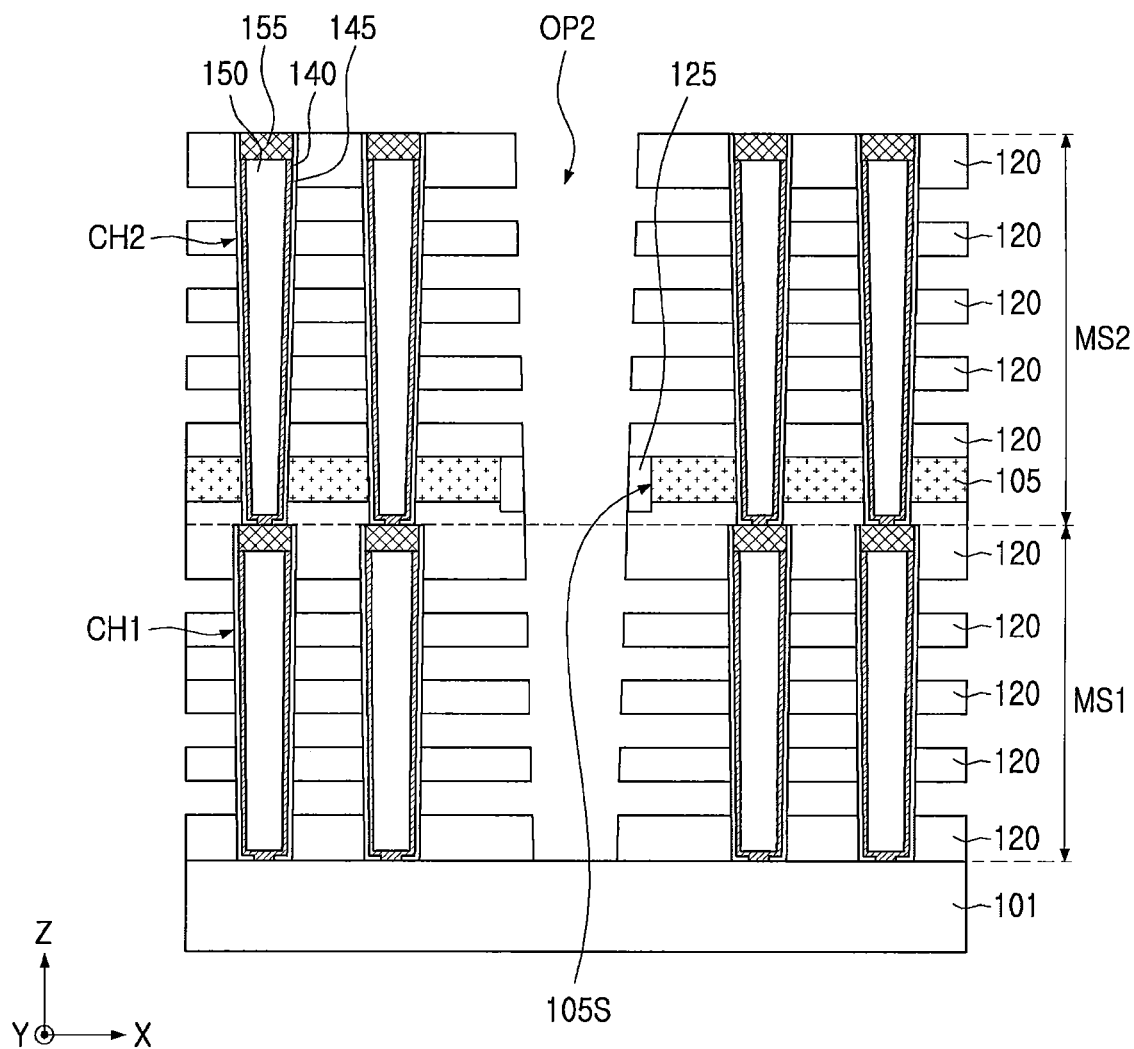

Referring to FIGS. 12 and 13J, at block S180, the sacrificial layers 180 are removed through the second opening OP2.

The sacrificial layers 180 may be selectively removed with respect to the interlayer insulation layers 120 and the buried insulation layer 125 using, e.g., wet etching, such that a plurality of lateral openings may be formed between the interlayer insulation layers 120 and sidewalls of the first and second channels CH1 and CH2 may be at least partly exposed through the plurality of lateral openings.

Figure 13K:
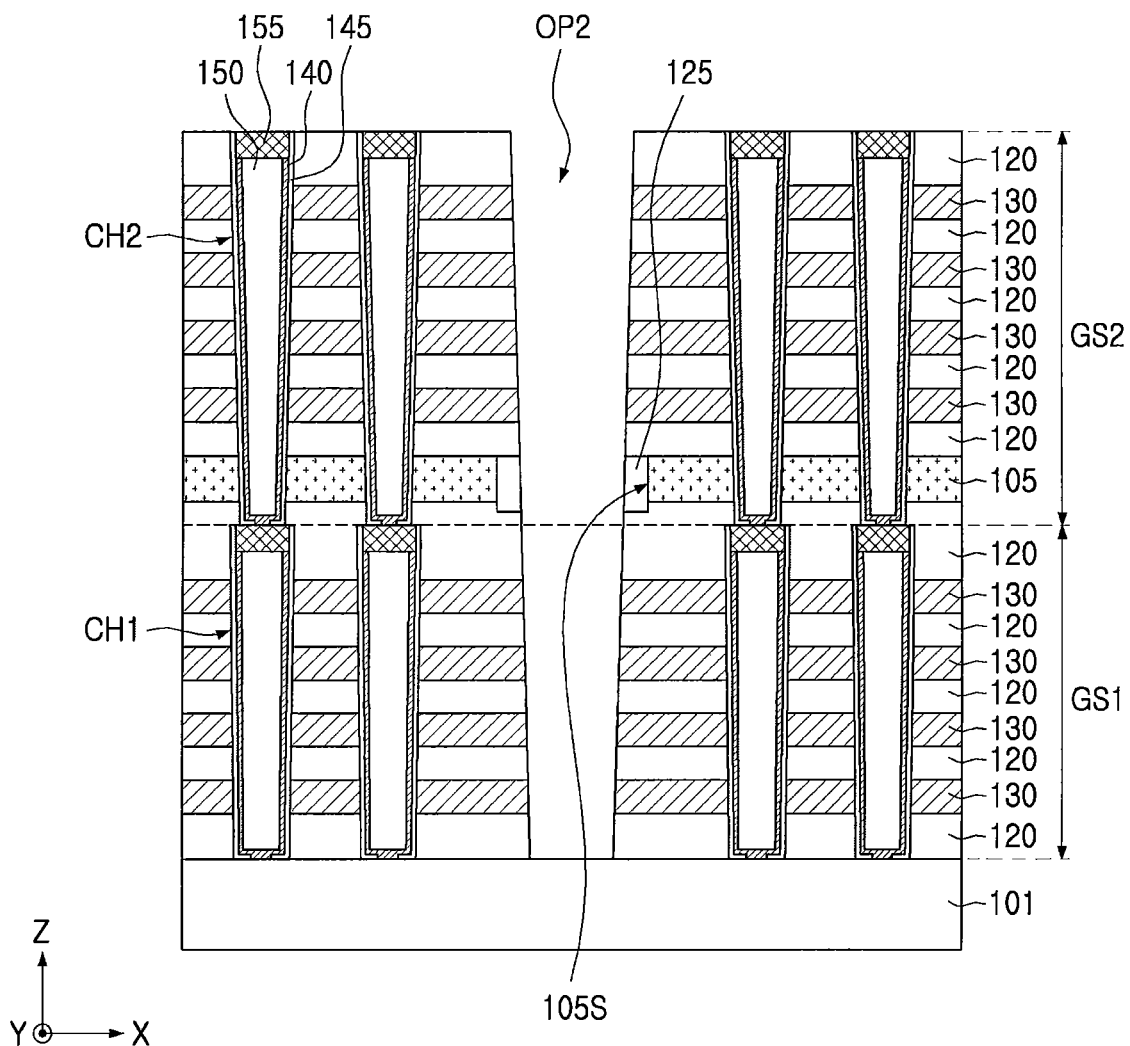

Referring to FIGS. 12 and 13K, at block S180, the gate electrodes 130 are formed in an area from which the sacrificial layers 180 are removed.

In some embodiments, in which the gate insulation layer 145 further includes an additional portion laterally extending along the gate electrodes 130, the additional portion of the gate insulation layer 145 may be formed prior to the gate electrodes 130. The gate electrodes 130 may include metal, polysilicon, or metal silicide. After forming the gate electrodes 130, a material for forming the gate electrodes 130 formed in the second opening OP2 may be removed through an additional etching process, such that the gate electrodes 130 may remain in only the lateral opening. In some embodiments, the interlayer insulation layers 120 may protrude farther than the gate electrodes 130 toward the second opening OP2.

Sidewalls of the gate electrodes 130 may lie on a substantially vertical plane. As shown in FIG. 13K, in the cross-section, the sidewalls of the gate electrodes 130 may be disposed substantially in a line. The sidewall 105S of the channel connection layer 105 may be laterally spaced apart from the aforementioned line. By forming the gate electrodes 130, the first gate structure GS1 and the second gate structure GS2 may be formed.

Figure 13L:
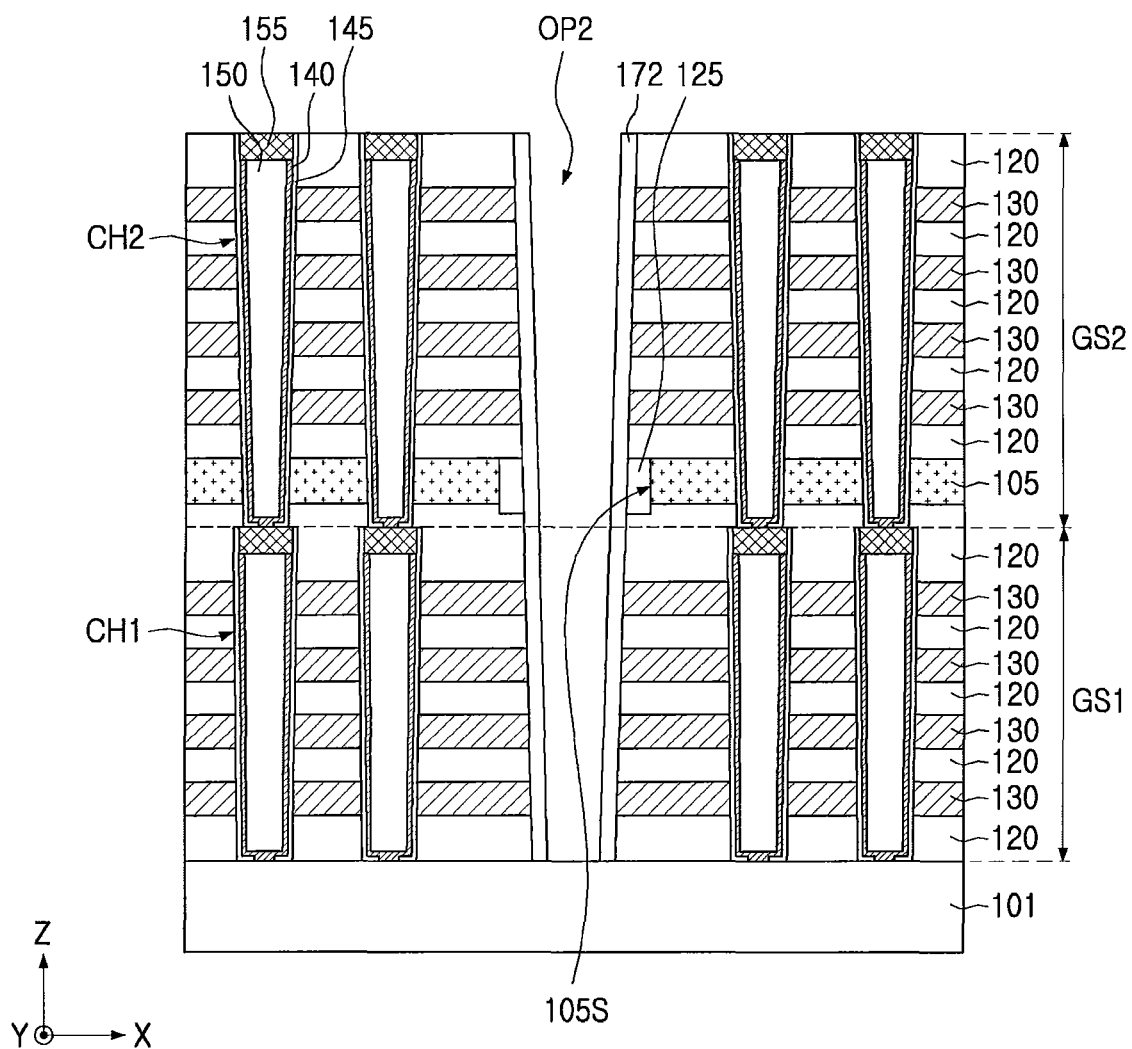

Referring to FIGS. 12, 13L, and 3, at block S190, the source insulation layer 172 and the source conductive layer 170 are formed in the second opening OP2 to form the separation region SA.

The source insulation layer 172 may be formed in a spacer form by forming an insulating material in the second opening OP2 and etching back the insulating material to expose the upper surface of the substrate 101.

Next, referring again to FIG. 3, the source conductive layer 170 may be formed by depositing a conductive material in a space defined by the source insulation layer 172. The gate electrodes 130 may be spaced a predetermined distance apart from one another in the X direction by the separation region SA.

Figure 14:
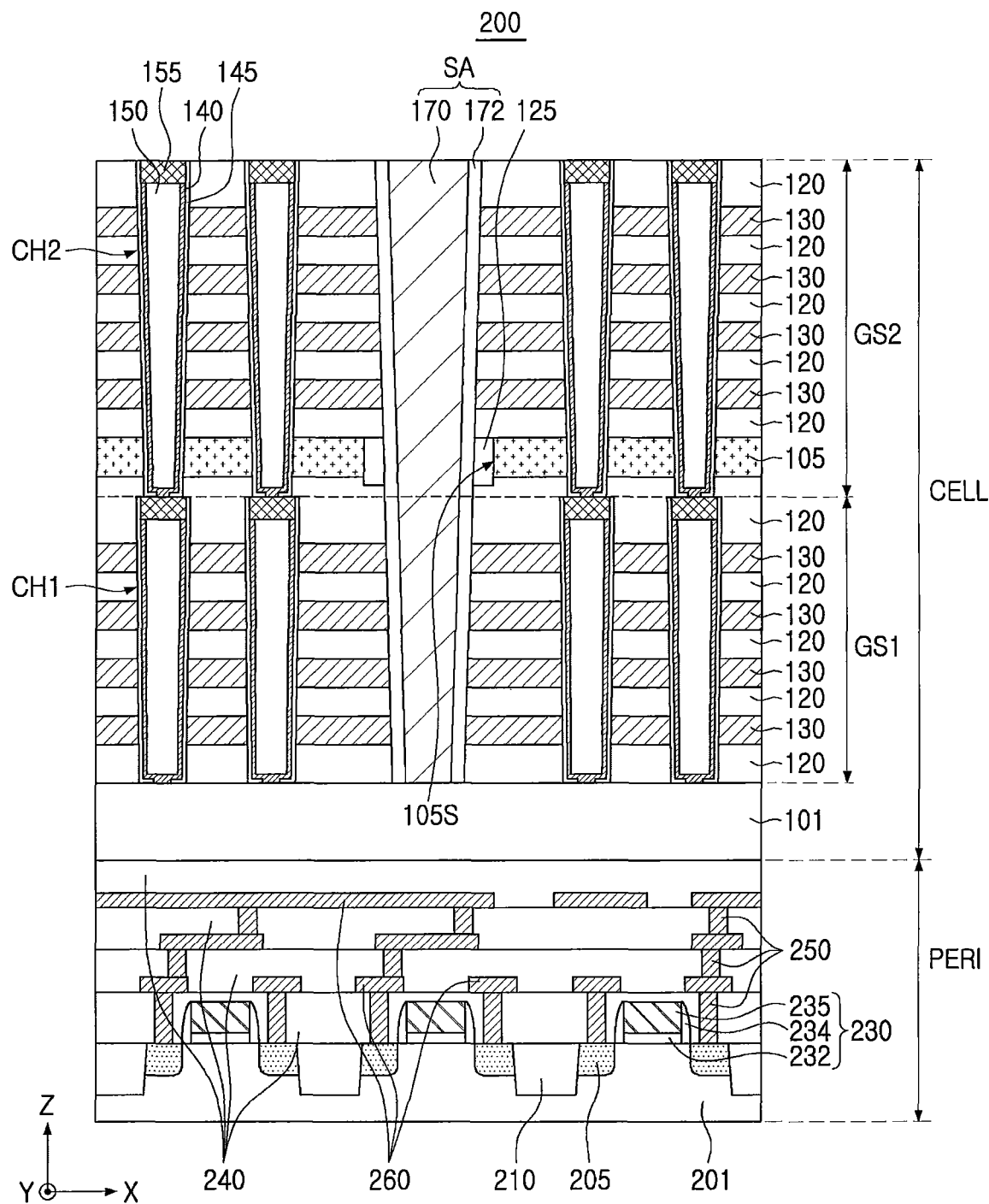
FIG. 14 is a cross-sectional view of a semiconductor device according to example embodiments of the inventive concept.

FIG. 14 is a cross-sectional view of a semiconductor device according to example embodiments of the inventive concept.

Referring to FIG. 14, a semiconductor device 200 includes a memory cell region CELL and a peripheral circuit region PERI. The memory cell region CELL may be disposed over the peripheral circuit region PERI relative to the base substrate 201. In some embodiments, the memory cell region CELL may be disposed below the peripheral circuit region PERI relative to the base substrate 201.

The memory cell region CELL includes the substrate 101, the first and second gate structures GS1 and GS2 on the substrate 101, the first and second channels CH1 and CH2 penetrating the first and second gate structures GS1 and GS2, respectively, and the separation regions SA on the substrate 101, like those described with reference to FIGS. 2 to 4.

Each of the first and second gate structures GS1 and GS2 may include the gate electrodes 130. The second gate structure GS2 may further include the channel connection layer 105 below the gate electrodes 130. Each of the first and second channels CH1 and CH2 may extend in the vertical direction perpendicular to the upper surface of the substrate 101 and include the channel region 140 therein. The separation regions SA may be laterally alternately arranged along with the first and second gate structures GS1 and GS2. The memory cell region CELL may have the same or similar structures according to the example embodiments described with reference to FIGS. 6 to 11.

The peripheral circuit region PERI includes a base substrate 201, circuit elements 230 on the base substrate 201, circuit contact plugs 250, and wiring lines 260.

The base substrate 201 may have an upper surface extending in the X direction and in the Y direction. Isolation patterns 210 may be formed in the base substrate 201 to define active regions. Source/drain regions 205 including an impurity may be disposed in each of the active regions. The base substrate 201 may include a semiconductor material, e.g., a group IV semiconductor, a group III-V compound semiconductor, and a group II-V compound semiconductor.

The circuit elements 230 may include planar transistors. Each of the circuit elements 230 may include a circuit gate insulation layer 232, a spacer layer 234, and a circuit gate electrode 235. The source/drain regions 205 may be disposed in the base substrate 201 at opposite sides of the circuit gate electrode 235.

A plurality of peripheral insulation layers 240 may be disposed on the base substrate 201 to at least partially cover the circuit elements 230. The circuit contact plugs 250 may penetrate the peripheral insulation layers 240 to be connected to the source/drain regions 205. An electrical signal may be applied to the circuit elements 230 through the circuit contact plugs 250. In an area not shown in FIG. 14, the circuit contact plugs 250 may be connected to the circuit gate electrode 235. The wiring lines 260 may be connected to the circuit contact plugs 250 and be formed of multiple layers. The wiring lines 260 may be electrically connected to the gate electrodes 130 of the first and second gate structures GS1 and GS2 in the memory cell region CELL. For example, the circuit elements 230 may be electrically connected to the gate electrodes 130 in the memory cell region CELL.

In a method of manufacturing the semiconductor device 200, after fabricating the peripheral circuit region PERI, the substrate 101 of the memory cell region CELL may be formed on the peripheral circuit region PERI and then the other elements of the memory cell region CELL may be fabricated on the substrate 101. The substrate 101 may have the same size as the base substrate 201 or have a smaller size than the base substrate 201.

While the present inventive concepts have been particularly shown and described with reference to example embodiments thereof, it will be understood by those of ordinary skill in the art that various changes in form and details may be made therein without departing from the spirit and scope of the present disclosure as defined by the following claims.

What is claimed is:

1. A semiconductor device comprising:
a substrate;
a first gate structure including first gate electrodes that are vertically stacked on the substrate;
first channels penetrating the first gate structure to contact the substrate;
a second gate structure comprising a channel connection layer on the first gate structure and second gate electrodes on the channel connection layer, the second gate electrodes vertically stacked on the channel connection layer;
second channels penetrating the second gate structure to contact the first channels, respectively; and
separation regions penetrating the second gate structure and the first gate structure and extending in a first direction,
wherein the channel connection layer is between the separation regions and has at least one sidewall that is spaced apart from sidewalls of the separation regions.

2. The semiconductor device of claim 1, wherein the at least one sidewall of the channel connection layer is laterally spaced apart from an extension line of sidewalls of the second gate electrodes.

3. The semiconductor device of claim 1, wherein the channel connection layer surrounds the second channels between the separation regions.

4. The semiconductor device of claim 1, wherein inner sidewalls of the channel connection layer surround the second channels and are aligned with an extension line defined by inner sidewalls of the second gate electrodes.

5. The semiconductor device of claim 1, wherein the channel connection layer is disposed between an uppermost one of the first gate electrodes and a lowermost one of the second gate electrodes.

6. The semiconductor device of claim 1, wherein the channel connection layer is vertically spaced apart from upper ends of the first channels relative to the substrate.

7. The semiconductor device of claim 1, further comprising a buried insulation layer between the channel connection layer and the separation regions.

8. The semiconductor device of claim 7, wherein a lower surface of the buried insulation layer is lower than a lower surface of the channel connection layer with respect to an upper surface of the substrate.

9. The semiconductor device of claim 1, wherein the second gate structure further comprises interlayer insulation layers that are alternately stacked along with the second gate electrodes, and
wherein the channel connection layer comprises a different material from the interlayer insulation layers and the second gate electrodes.

10. The semiconductor device of claim 1, wherein distances between the channel connection layer and a first one of the separation regions differ at opposite sides of the first separation region.

11. The semiconductor device of claim 1, wherein the at least one sidewall of the channel connection layer is substantially perpendicular to an upper surface of the substrate.

12. The semiconductor device of claim 1, wherein each of the separation regions comprises a source conductive layer and a source insulation layer that at least partially covers a sidewall of the source conductive layer.

13. The semiconductor device of claim 1, wherein each of the first and second channels comprises a gate insulation layer, a channel region, and a channel pad,
wherein the gate insulation layer and the channel region are sequentially stacked on sidewalls of corresponding ones of the first and second gate electrodes, and
wherein the channel pad is disposed at an upper end of each of the first and second channels relative to the substrate and is connected to the channel region.

14. The semiconductor device of claim 13, wherein the channel pad of each of the first channels is connected to the channel region of a corresponding one of the second channels.

15. The semiconductor device of claim 1, further comprising a circuit region below the substrate, wherein the circuit region comprises transistors that are electrically connected to the first and second gate electrodes.

16. A semiconductor device comprising:
a substrate;
a first gate structure comprising first gate electrodes that are vertically stacked on the substrate;
a first channel penetrating the first gate structure;
a second gate structure comprising a channel connection layer on the first gate structure and second gate electrodes on the channel connection layer, the second gate electrodes vertically stacked on the channel connection layer;
a second channel penetrating the second gate structure; and
a separation region penetrating the second gate structure and the first gate structure and extending in a first direction,
wherein a sidewall of the channel connection layer is laterally spaced apart from an extension line defined by sidewalls of the second gate electrodes, adjacent to the separation region.

17. The semiconductor device of claim 16, wherein the sidewall of the channel connection layer is spaced apart from the extension line toward the second channel.

18. The semiconductor device of claim 16, wherein the sidewall of the channel connection layer protrudes from the extension line toward the separation region.

19. The semiconductor device of claim 16, wherein the channel connection layer contacts the first channel.

20. A semiconductor device comprising:
a substrate;
first gate electrodes vertically spaced apart from one another on the substrate;
first channels penetrating the first gate electrodes to contact the substrate;
second gate electrodes vertically spaced apart from one another over the first gate electrodes;
second channels penetrating the second gate electrodes and contacting the first channels, respectively;
separation regions separating the first and second gate electrodes in a first direction and extending in a direction; and
channel connection layers on the first gate electrodes,
wherein the channel connection layers are spaced apart from the separation regions, and each of the channel connection layers surrounds the second channels.

* * * * *